(12) United States Patent
Imanishi et al.

(10) Patent No.: US 6,332,268 B1
(45) Date of Patent: Dec. 25, 2001

(54) METHOD AND APPARATUS FOR PACKAGING IC CHIP, AND TAPE-SHAPED CARRIER TO BE USED THEREFOR

(75) Inventors: Makoto Imanishi, Neyagawa; Yoshifumi Kitayama, Hirakata; Koichi Kumagai, Ikoma; Shinji Kanayama, Kashihara; Yoshinori Wada, Moriguchi; Takahiro Yonezawa; Kazushi Higashi, both of Neyagawa, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/254,687

(22) PCT Filed: Sep. 16, 1997

(86) PCT No.: PCT/JP97/03257

§ 371 Date: Mar. 16, 1999

§ 102(e) Date: Mar. 16, 1999

(87) PCT Pub. No.: WO98/12908

PCT Pub. Date: Mar. 26, 1998

(30) Foreign Application Priority Data

Sep. 17, 1996 (JP) .................................................. 8-244709

(51) Int. Cl.$^7$ ...................................................... H05K 3/30
(52) U.S. Cl. .................................. 29/832; 29/840; 29/740
(58) Field of Search ........................... 29/827, 825, 826, 29/832, 840, 740; 427/96

(56) References Cited

U.S. PATENT DOCUMENTS

| | | | |
|---|---|---|---|
| 3,785,903 | * | 1/1974 | Boyer et al. . |
| 3,858,721 | * | 1/1975 | Boyer et al. . |
| 3,871,936 | * | 3/1975 | Boyer et al. . |
| 4,029,536 | * | 6/1977 | Ludwig et al. . |
| 4,345,371 | * | 8/1982 | Ohsawa et al. . |
| 4,585,157 | * | 4/1986 | Belcher . |
| 5,250,469 | * | 10/1993 | Tanaka et al. . |
| 5,323,947 | * | 6/1994 | Juskey et al. . |
| 5,343,363 | * | 8/1994 | Greeson et al. . |
| 5,648,136 | * | 7/1997 | Bird . |
| 5,662,262 | * | 9/1997 | McMahon et al. . |
| 5,729,963 | * | 3/1998 | Bird . |
| 5,738,816 | * | 4/1998 | Tidemann et al. . |
| 5,846,621 | * | 12/1998 | Nagamatsu . |

FOREIGN PATENT DOCUMENTS

| | | | |
|---|---|---|---|
| 5-335405 | * | 12/1993 | (JP) . |
| 6-29299 |   | 2/1994 | (JP) . |

\* cited by examiner

*Primary Examiner*—Carl J. Arbes
(74) *Attorney, Agent, or Firm*—Wenderoth, Lind & Ponack, L.L.P.

(57) ABSTRACT

An IC chip (2) can be provided to a pre-mount process while being held on a tape-shaped supporting member (5), without being taken out of the tape-shaped supporting member (5).

38 Claims, 21 Drawing Sheets

METHOD AND APPARATUS FOR PACKAGING IC CHIP, AND TAPE-SHAPED CARRIER TO BE USED THEREFOR

TECHNICAL FIELD

The present invention relates to a method and an apparatus for mounting IC chips and a tape-shaped supporting member used in the same. In particular, a pre-mount process such as bump formation on the IC chip, leveling of bump heights, processing of inspecting for good bump formation, etc. while the IC chip is held to the tape-shaped supporting member, is conducted before each IC chip is mounted.

BACKGROUND ART

Conventionally, IC chips are transferred to a pre-mount process while stored as a wafer in a wafer storage case or accommodated in recesses of a tray after being taken out of the wafer. In the pre-mount process, bumps are formed to the IC chips taken outside one by one from the wafer or tray, the heights of the bumps are leveled, the formation of the bumps is inspected, and finally the IC chips are returned to the wafer storage case or tray to be transferred to a mount process. Again the IC chips are sequentially taken out one by one from the wafer storage case or tray and mounted to a board in the mount process.

In the above-described structure, the IC chips are taken out from the tray, a predetermined pre-mount processing is performed on the IC chip, the IC chips are stored again in the tray or the like, and further caught outside from the tray or the like in the mount process. The IC chips are often damaged when taken out of the tray or returned to the tray. Although the IC chips are naturally easy to damage and, therefore, it is preferable not to touch them, the conventional arrangement requires frequent movement of the IC chips. As such, a method enabling handling of the IC chips without touching them much in the premount process, etc. is necessary.

The present invention is devised to solve the above-described issue, and has for its object to provide a method and an apparatus for mounting IC chips, and a tape-shaped supporting member used in the same. The IC chips can be subjected to a pre-mount process, etc. without being taken out of a storage member up to a mount process.

SUMMARY OF THE INVENTION

In accomplishing this and other objects, the present invention is constituted so that IC chips are subjected to a pre-mount process while being held in a tape-shaped supporting member (i.e., a support tape member) as a storing member without being taken out from the tape-shaped supporting member.

According to the constitution, in the pre-mount process, a pre-mount treatment such as a bump formation process and the like is carried out without taking out the IC chips from the tape-shaped supporting member.

In other words, the IC chips are kept in the tape-shaped supporting member, whereby the IC chips are surely prevented from being damaged, as will be caused when the IC chips were taken outside from and returned to a tape-shaped supporting member before a mount process. At the same time, an apparatus for taking out and returning the IC chips to the tape-shaped supporting member can be eliminated, and a process for taking out and returning the IC chips to the tape-shaped supporting member can be eliminated so that a cycle time of the whole mount process for the IC chips can be shortened.

In the conventional constitution wherein the IC chips are accommodated in the tray, the accommodation recess of the tray is formed in size to conform to the IC chip to avoid an unexpected movement of the IC chip therein. In other words, the tray of a corresponding size should be prepared when the IC chip is changed in size. According to the present invention, when the tape-shaped supporting member has a metallic layer, an opening formed in the metallic layer of the tape-shaped supporting member is set to be not smaller than the maximum size of various IC chips. Therefore, one kind of the tape-shaped supporting member is sufficient for IC chips of any size and has general versatility. The tape-shaped supporting member without the metallic layer can provide the above general versatility as it is. The issue inherent in the prior art can be thus eliminated.

Even when the opening is larger than the IC chip, an adhesive layer of the tape-shaped supporting member for general purpose use prevents the IC chip from unexpectedly moving inside the opening and being damaged.

A suction pressure to the IC chip when the IC chip is small decreases in each process due to a reduced number of vacuum suction holes facing the IC chip through which the IC chip is sucked, resulting in a problem. An increase in adhesion of the adhesive layer of the tape-shaped supporting member can compensate for the insufficient suction pressure.

If the IC chip itself warps, bumps are apt to be irregularly leveled in the pre-mount process in the prior art. However, if the bumps are leveled while the IC chip is held to the tape-shaped supporting member, the warp of the IC chip can be absorbed by a base film of the tape-shaped supporting member when a press force is applied to the tape-shaped supporting member and the IC chip during the leveling operation. Accuracy in leveling can be accordingly further improved.

Further, a devised arrangement of integrally taking out a part of the tape-shaped supporting member and IC chip from the tape-shaped supporting member can form a good junction in a bump bonding process as an example of the pre-mount process, and also effectively prevents the IC chip from being damaged when the IC chip is taken outside from the tape-shaped supporting member.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
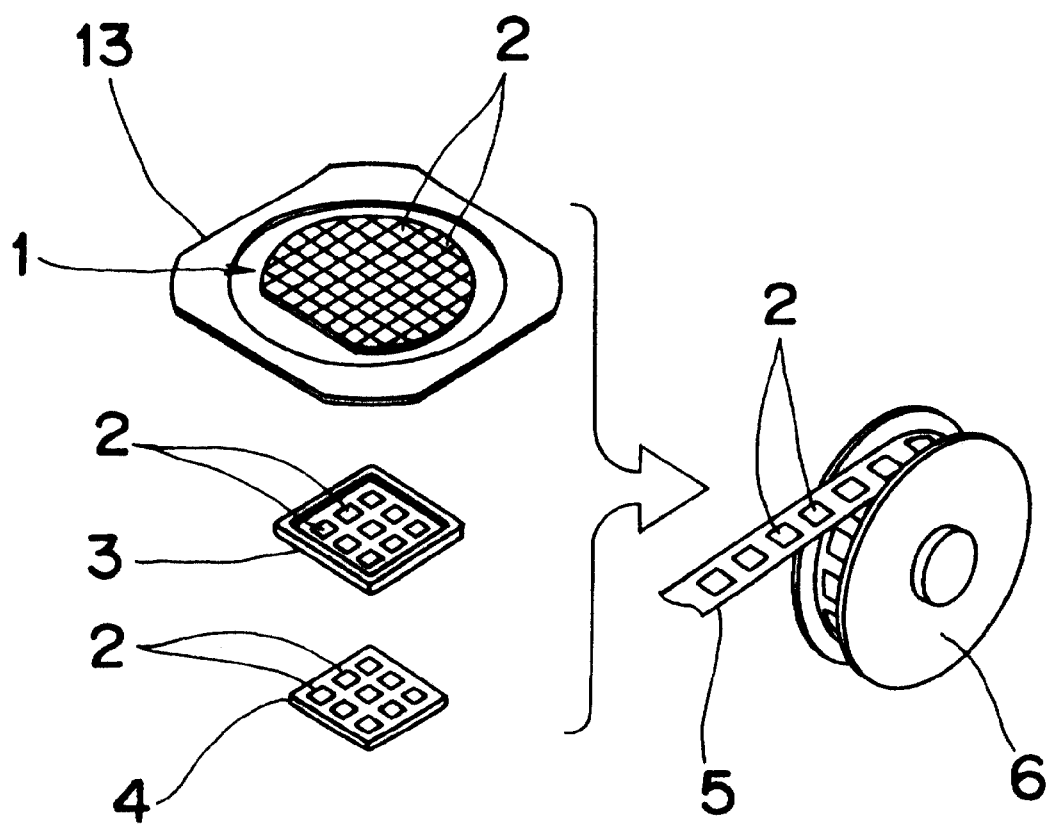
FIG. 1 is a diagram explanatory of a state when an IC chip is held to a tape-shaped supporting member in an IC chip mount method according to a first embodiment of the present invention.
Figure 2:
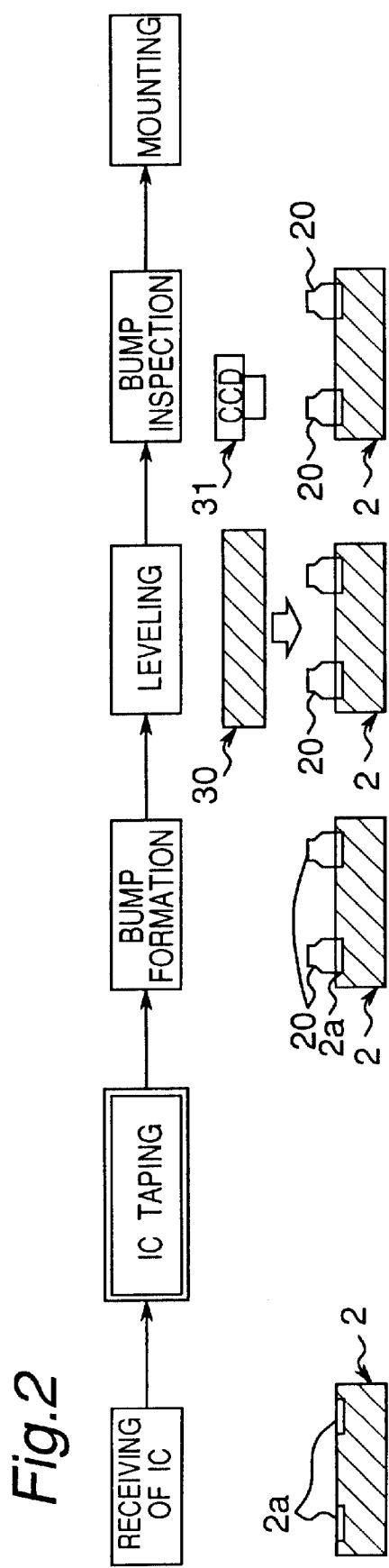
FIG. 2 is a diagram descriptive of the mount method of the first embodiment.

Before the description of the present invention proceeds, it is to be noted that like parts are designated by like reference numerals throughout the accompanying drawings.

Hereinbelow, an IC chip mount method, an IC chip mounting apparatus, and a tape-shaped supporting member according to preferred embodiments of the present invention will be described in detail with reference to FIGS. 1–19.

According to an IC chip mount method of a first embodiment of the present invention, as shown in FIG. 1, from a state where IC chips are received by a user (for example, from a wafer storage case 13 accommodating a wafer 1 having a number of IC chips 2, or a tray 3 or 4 accommodating a number of IC chips 2), the IC chips 2 are held one by one on a tape-shaped supporting member 5 (support tape member). In other words, the IC chips are arranged in a line along a supporting member 5 that is generally shaped as a narrow, elongated, flexible (tape-shaped) strip such as ordinary adhesive tape. Then, the elongated (tape-shaped) supporting member holding the IC chips 2 is stored on a reel 6, and this process is called IC chip taping. While the IC chips 2 are held in the tape-shaped supporting member 5 wound on the reel 6, the held IC chips 2 are transferred to a pre-mount process from the IC chip taping process, where the IC chips 2 while being supported in the tape-shaped supporting member 5 are subjected to a pre-mount treatment, e.g., bump bonding, etc. The IC chips 2 are then taken out from the tape-shaped supporting member 5 sequentially one by one and mounted to a board 100 (with reference to FIG. 2).

Figure 3:
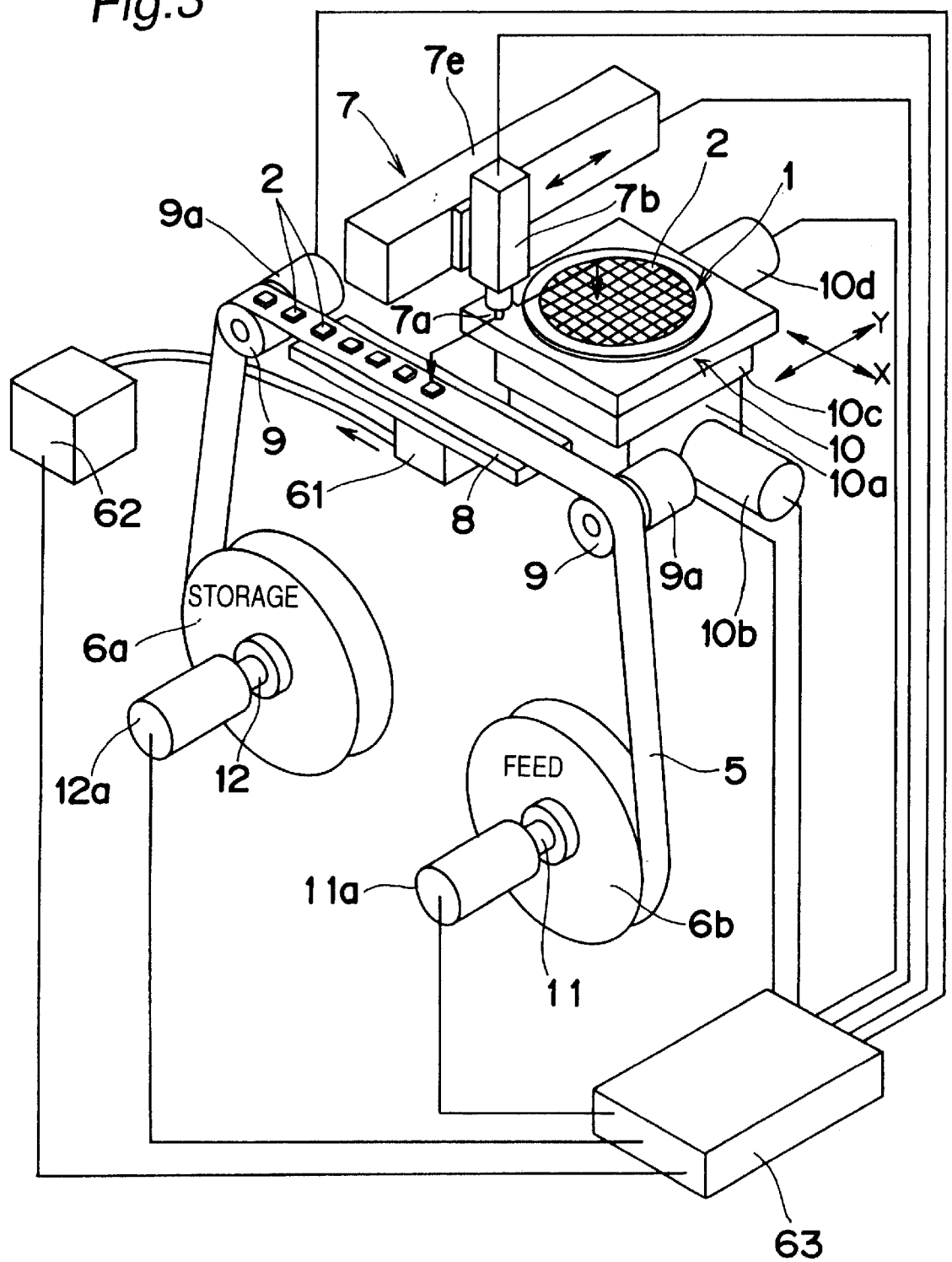
FIG. 3 is a partial schematic perspective view of a taping apparatus carrying out a taping process of the mount method.
Figure 4:
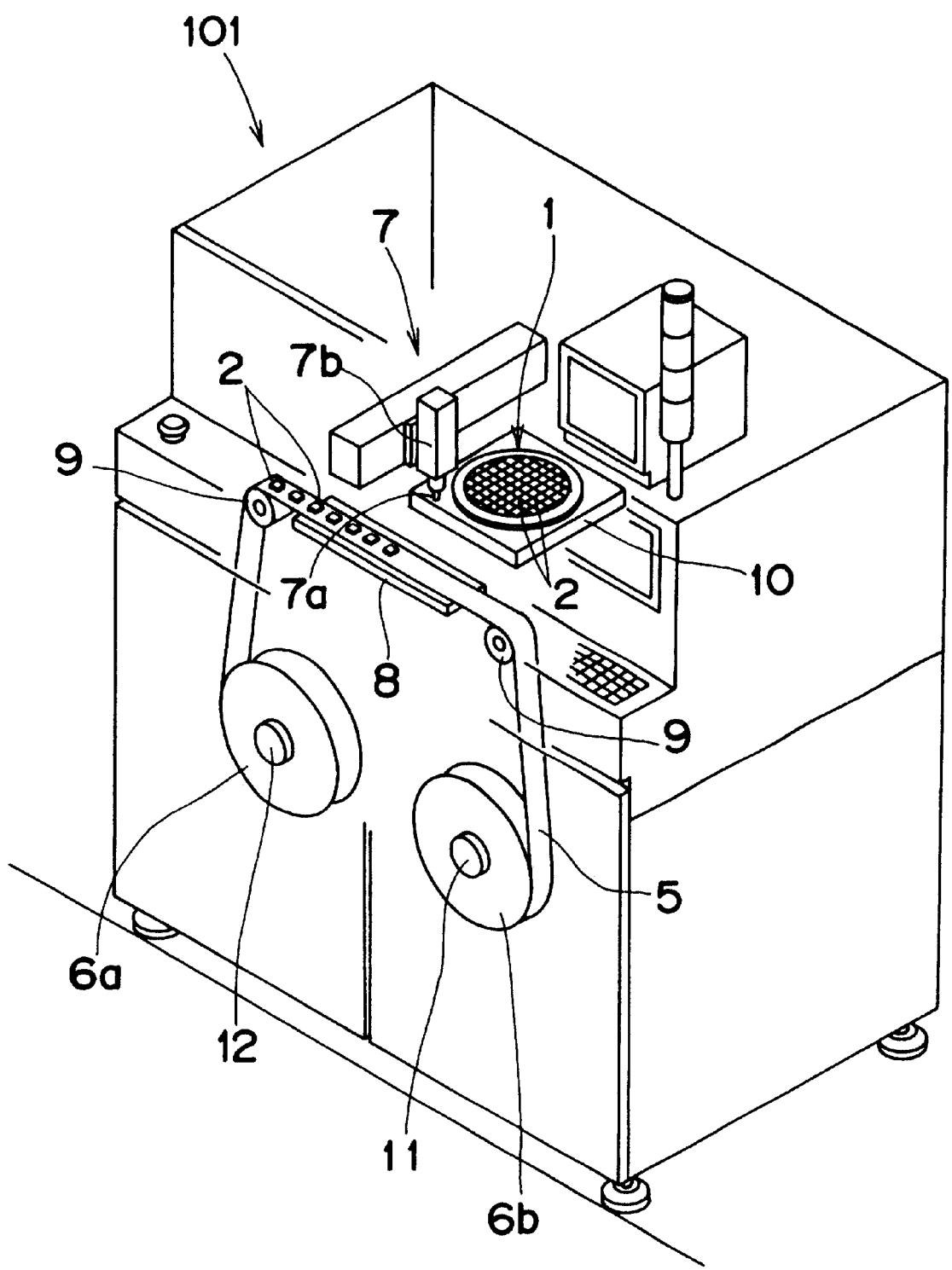
FIG. 4 is a schematic perspective view of the taping apparatus.

The taping process and a taping apparatus 101 whereby the IC chips 2 are brought out from the tray 3 or the like and held by the tape-shaped supporting member 5 are shown in FIGS. 3 and 4. In the drawings, 6b denotes a feed reel storing the tape-shaped supporting member 5 which is to support the IC chips 2, the feed reel 6b being engaged with and held by a feed shaft 11 rotated and driven by a driving device 11a such as a motor or the like. 6a denotes a storage reel holding the tape-shaped supporting member 5 with the IC chips 2 therein, and the storage reel 6a is engaged with and held by a feed shaft 12 rotated and driven by a driving device 12a such as a motor or the like. 61 is a vacuum suction unit, and 62 is a vacuum pump used by the vacuum suction unit 61. 8 denotes a guide plate which intermittently fixes at a predetermined position the tape-shaped supporting member 5 wound to and supplied from the feed reel 6b by vacuum suction or the like manner, and also guides the tape-shaped supporting member 5 stably towards the storage reel 6a when freed from the fixing. The vacuum suction unit 61 is fixed to a lower face of the guide plate 8 and driven by the vacuum pump 62 to vacuum-suck the tape-shaped supporting member 5 to the guide plate 8 through suction through holes formed in the guide plate 8. 9 denotes a guide roller which is arranged at each end part of the guide plate 8 and is rotated by a driving device 9a such as a motor to guide the tape-shaped supporting member 5 along the guide plate 8. 10 is a stage supporting the wafer 1 thereon, and the stage 10 is an XY table. Specifically, an X table 10a is reciprocated by a driving device 10b such as a motor or the like in an X-axis direction parallel to a run direction of the tape-shaped supporting member 5, while a Y table 10c is reciprocated by a driving device 10d such as a motor or the like in a Y-axis direction orthogonal to the run direction of the tape-shaped supporting member 5 (the X-axis direction). 7 is an IC chip transfer section having a nozzle 7a for sucking the IC chip 2 one by one from the wafer 1. As indicated in FIG. 3, the IC chip transfer section 7 moves the nozzle 7a up and down by means of a driving device 7b such as a motor or the like. Moreover, the transfer section 7 reciprocates the nozzle 7a and the driving device 7b only in the Y-axis direction by a driving device such as a motor or the like along a movement unit 7e under the guidance by the movement unit 7e. On the other hand, the stage 10 can be moved in both directions, namely, X-axis and Y-axis directions by the XY table. Accordingly, all of the IC chips on the stage 10 can be sucked by the nozzle 7a when the stage 10 is suitably moved in the X-axis and Y-axis directions. 63 denotes a control device for controlling the driving of the up-down driving device 7b and Y-axis directional driving device of the IC chip transfer section 7, driving devices 11a, 12a for rotary shafts 11, 12, vacuum pump 62, driving devices 10b, 10d for the stage 10, and driving device 9a for each guide roller 9. The tape-shaped supporting member 5 is supplied to the guide plate 8 from the feed reel 6b through the intermittent rotation of two feed shafts 11, 12 in the taping apparatus 101. Meanwhile, the tape-shaped supporting member 5 is vacuum-sucked to a surface of the guide plate 8 by the vacuum suction unit 61 thereby to be intermittently fixed to the guide plate and, at the same time, the IC chips 2 are sucked one by one from the wafer 1 by the nozzle 7a driven by the IC chip transfer section 7 and then transferred to a predetermined position on the tape-shaped supporting member 5 fixed to the guide plate 8. The sucked IC chips 2 are firmly held at the tape-shaped supporting member 5. The tape-shaped supporting member 5 holding the IC chips 2 is intermittently moved at every predetermined pitch to be eventually wound to the storage reel 6a. The IC chips 2, held at every predetermined distance on the tape-shaped supporting member 5, are packed (for example, vacuum-packed) while the tape-shaped supporting member 5 is kept wound to the reel 6, so that the IC chips 2 are protected from the adhesion of dust, etc. The IC chips 2 in this state are sent to the pre-mount process.

Figure 5A:
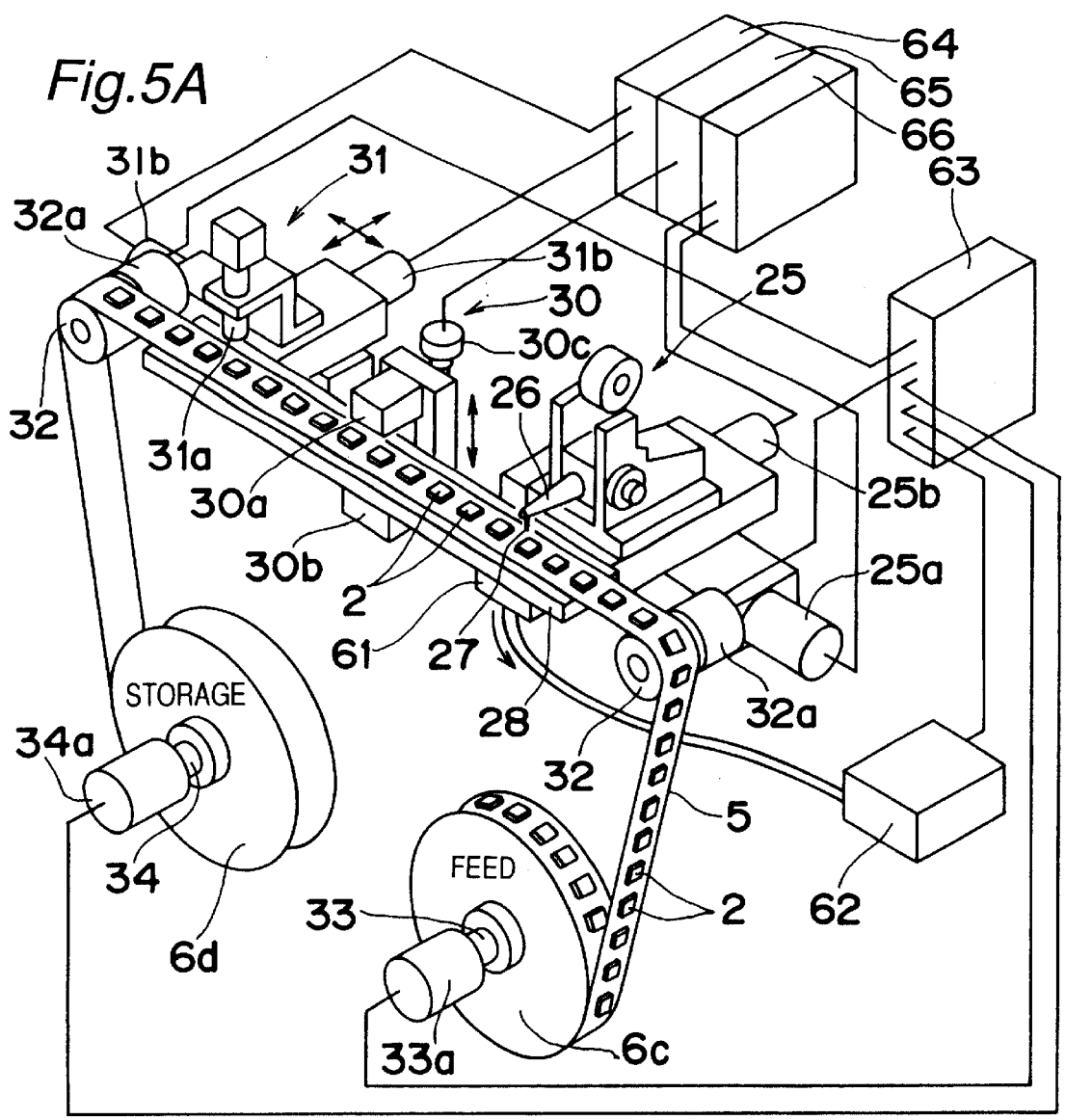
FIG. 5A is a partial schematic perspective view of a bump forming apparatus carrying out a bump formation process in the mount method.
Figure 5B:
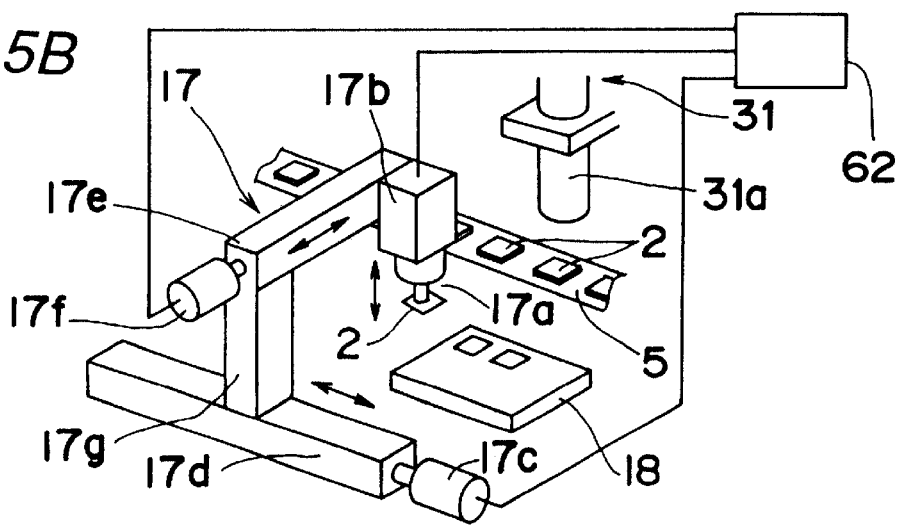
FIG. 5B is a perspective view of an IC chip removing apparatus for taking out an improper IC chip in the mount method.
Figure 6:
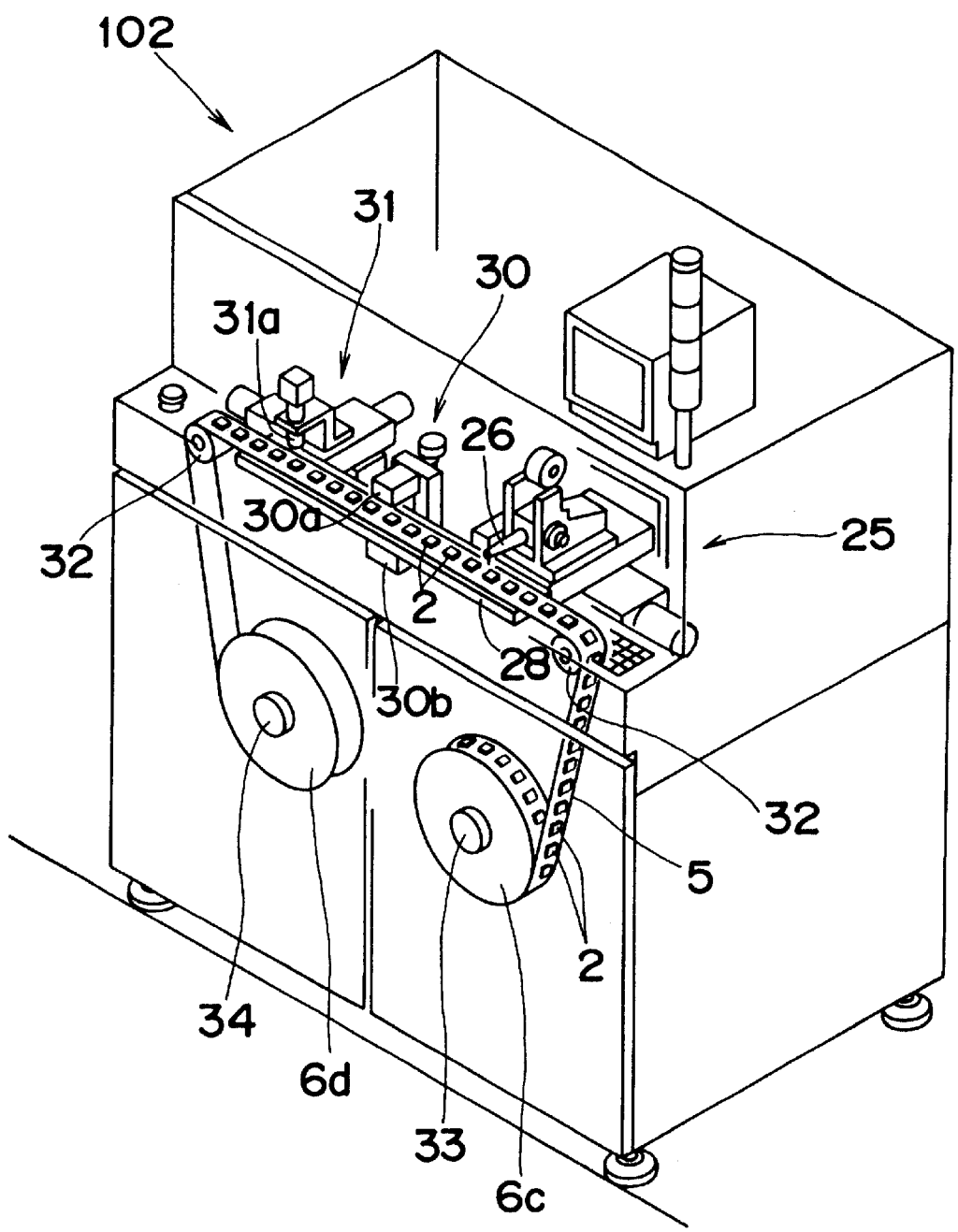
FIG. 6 is a schematic perspective view of the bump forming apparatus.

In the embodiment, a bump formation process which is carried out by a bump forming apparatus 102 will be discussed by way of an example of the pre-mount process. In the premount process as shown in FIGS. 5A and 6, bumps 20 of gold or the like are formed at groove parts 2a of each IC chip 2 by a bump bonding apparatus 25. Thereafter, every bump 20 formed on each IC chip 2 is leveled so as to be made nearly equal in height from a rear face (mount face) of the IC chip 2. The quality (i.e., whether it s good or no good) of the bump formation is detected. That is, whether or not the bump 20 is formed at the groove parts 2a of the IC chip 2, whether or not the bump 20 comes outside the groove part 2a which is a bump formation position at the IC chip 2, and the like, are determined. The IC chips 2 with successfully formed bumps 20 are sent to a mount process. In the bump forming apparatus 102 executing the pre-mount process, the reel 6 holding the IC chips 2 sent from the taping process works as a feed reel 6c, and is engaged with and held by a feed shaft 33 rotated by a driving device 33a such as a motor. The tape-shaping supporting member 5 is intermittently sent onto a guide plate 28 by the guide of a guide roller 32 disposed at each end part of the guide plate 28, and is finally wound to a storage reel 6d engaged with and held by a feed shaft 34 rotated by a driving device 34a such as a motor or the like. The bump bonding apparatus 25 supplies a gold bump formation wire from a capillary 27 at a leading end of a bump bonding head 26, forms a ball part with the use of a leading end of the capillary 27, and then forms the bump 20 at the groove part 2a of the IC chip 2 on the tape-shaped supporting member 5 intermittently fixed on the guide plate 28 through vacuum suction by a vacuum suction apparatus (including the vacuum pump 62 and the vacuum suction unit 61 as shown in FIG. 3), while utilizing ultrasonic vibration. The bump bonding apparatus 25 utilizes ultrasonic vibrations at this time. Every time the bumps 20 are completely formed on one IC chip 2, two feed shafts 33,34 are intermittently rotated thereby sending the bumps 20 formed on the IC chip 2 to a leveling apparatus 30 via the tape-shaped supporting member 5. All bumps 20 formed on the IC chip 2 are pressed by an upper and a lower press board 30a, 30b. Thus, leading ends of the bumps 20 are pressed and slightly crushed, so that the bumps 20 are generally made uniform in height from the rear face of the IC chip 2. For instance, irregular bumps of 50–60 $\mu$m heights are turned to bumps 20 of nearly uniform 45±2 $\mu$m heights. The subsequent intermittent rotation of the feed shafts 33, 34 sends the IC chips 2 with the leveled bumps 20 to a bump formation inspecting apparatus 31 via the tape-shaped supporting member 5. A shape and a position of each bump 20 are inspected on plane from above the IC chip 2 by a CCD camera 31a of the inspecting apparatus 31. That is, it is determined whether or not each bump 20 is formed at the groove 2a where the bump is supposed to be formed on the IC chip 2, whether the bump 20 goes beyond the groove 2a, etc. The IC chip 2 which is judged to have an inadequate bump (bumps) 20 is taken off of the tape-shaped supporting member 5 by an IC chip removing apparatus 17. As shown in FIG. 5B, the IC chip removing apparatus 17 is arranged at the downstream side of the inspecting apparatus 31. A supporting arm 17g is moved parallel to an X-axis unit 17d, i.e., in the X-axis direction parallel to the run direction of the tape-shaped supporting member 5 when a driving device 17c such as a motor operates. A suction nozzle 17a suspended and supported at a Y-axis unit 17e supported by the supporting arm 17g is reciprocated along the Y-axis direction when a driving device 17f, e.g., a motor operates. The suction nozzle 17a is driven to move up and down by a driving device 17b such as a motor or the like. The inadequate chip 2 on the tape-shaped supporting member 5 is collected into an inadequate chip collection section 18 after the chip is sucked by the suction nozzle 17a and taken out from the supporting member 5. The driving of each driving device 17c, 17f, 17b of the IC chip removing apparatus 17 is controlled by the above control device 62 based on the inspection result of the inspecting apparatus 31. Meanwhile, the IC chips 2 with adequate bumps 20 are wound to a storage reel 6d while being held on the tape-shaped supporting member 5. The reel 6d taking up the supporting member 5 is transferred to the mount process. At this time, when the pre-mount process and the mount process are arranged adjacent to each other via a clean room, etc., the reel 6d is directly sent to the mount process. In the case where the pre-mount process and the mount process are not connected via the clean room and IC chips 2 might be contaminated by dust, etc. when transferred to the mount process, the IC chips are preferred to be vacuum-packed together with the reel before being transferred. A bump bonding operation of the bump bonding apparatus 25, the driving of a driving device 25a, such as a motor or the like, for moving the bump bonding apparatus 25 in the X-axis direction parallel to the run direction of the tape-shaped supporting member 5, and the driving of a driving device 25b such as a motor, etc. for moving the bump bonding apparatus 25 in the Y-axis direction orthogonal to the X-axis direction are controlled by a control device 66. The driving of a driving device 30c such as a motor for driving the upper and lower press boards 30a, 30b of the leveling apparatus 30 is controlled by a control device 65.

An inspection operation of the inspecting apparatus 31 and the driving of a driving device 31b such as a motor for moving the CCD camera 31a in the X-axis and Y-axis directions are controlled by a control device 64. The control device 63 (with reference to FIG. 3, etc.) controls the driving of the vacuum suction apparatus, the driving devices 33a, 34a for the rotary shafts 33, 34, and the driving device 32a for the two guide rollers 32 of FIG. 5A.

Figure 7:
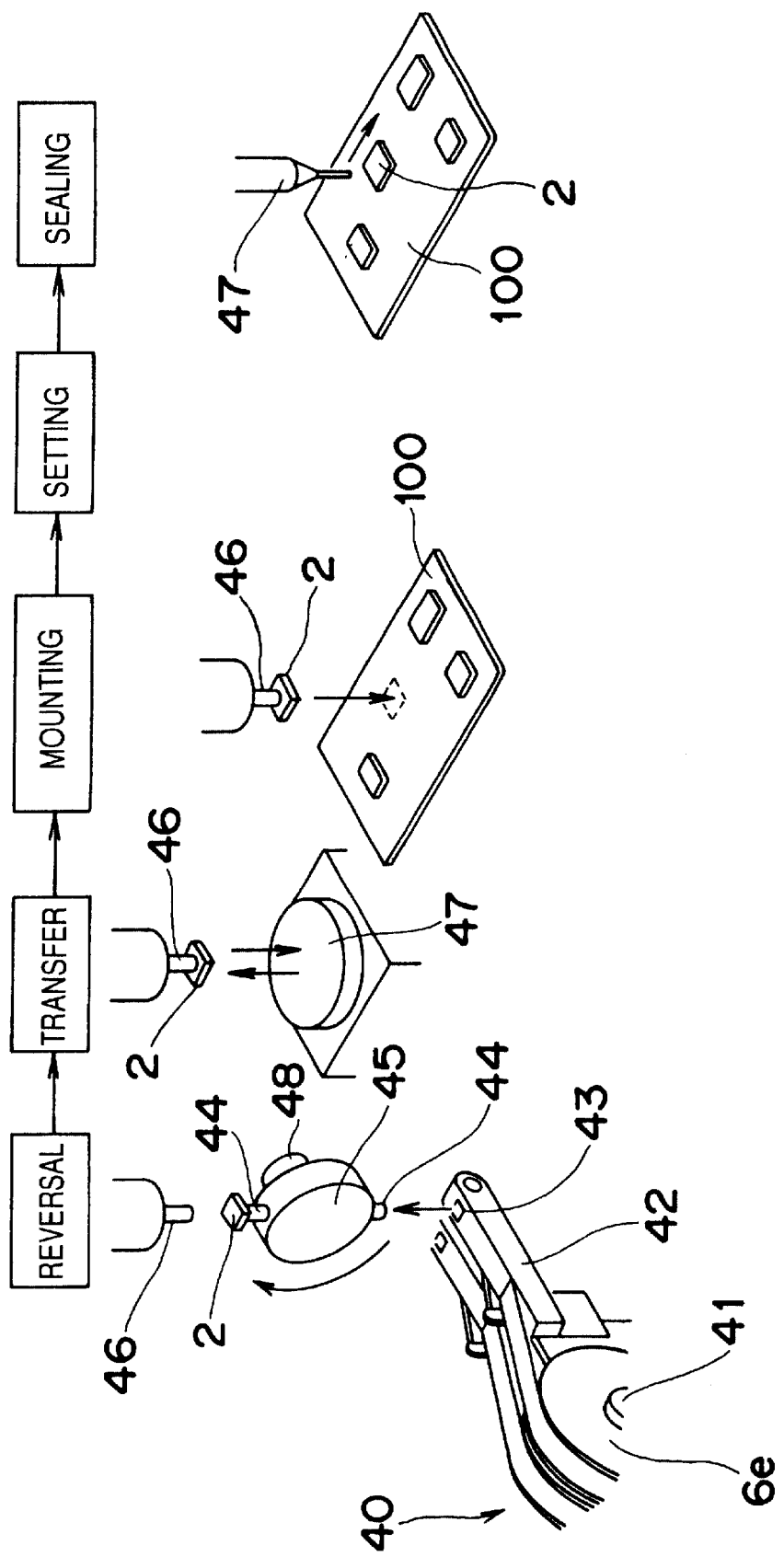
FIG. 7 is an exploded explanatory diagram of a mount process of the mount method.
Figure 8:
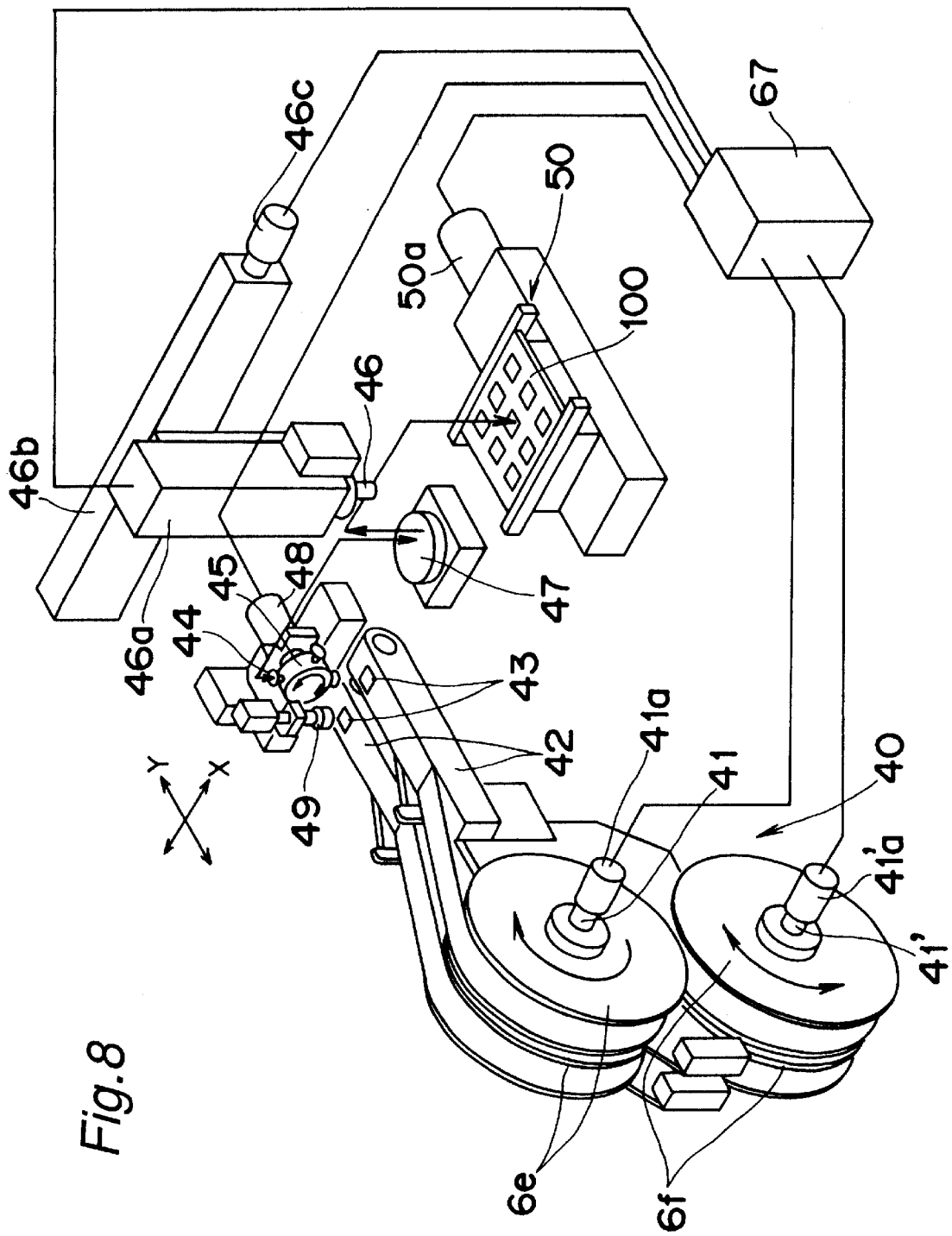
FIG. 8 is a partial schematic perspective view of a mounting machine executing the mount process of FIG. 7.
Figure 9:
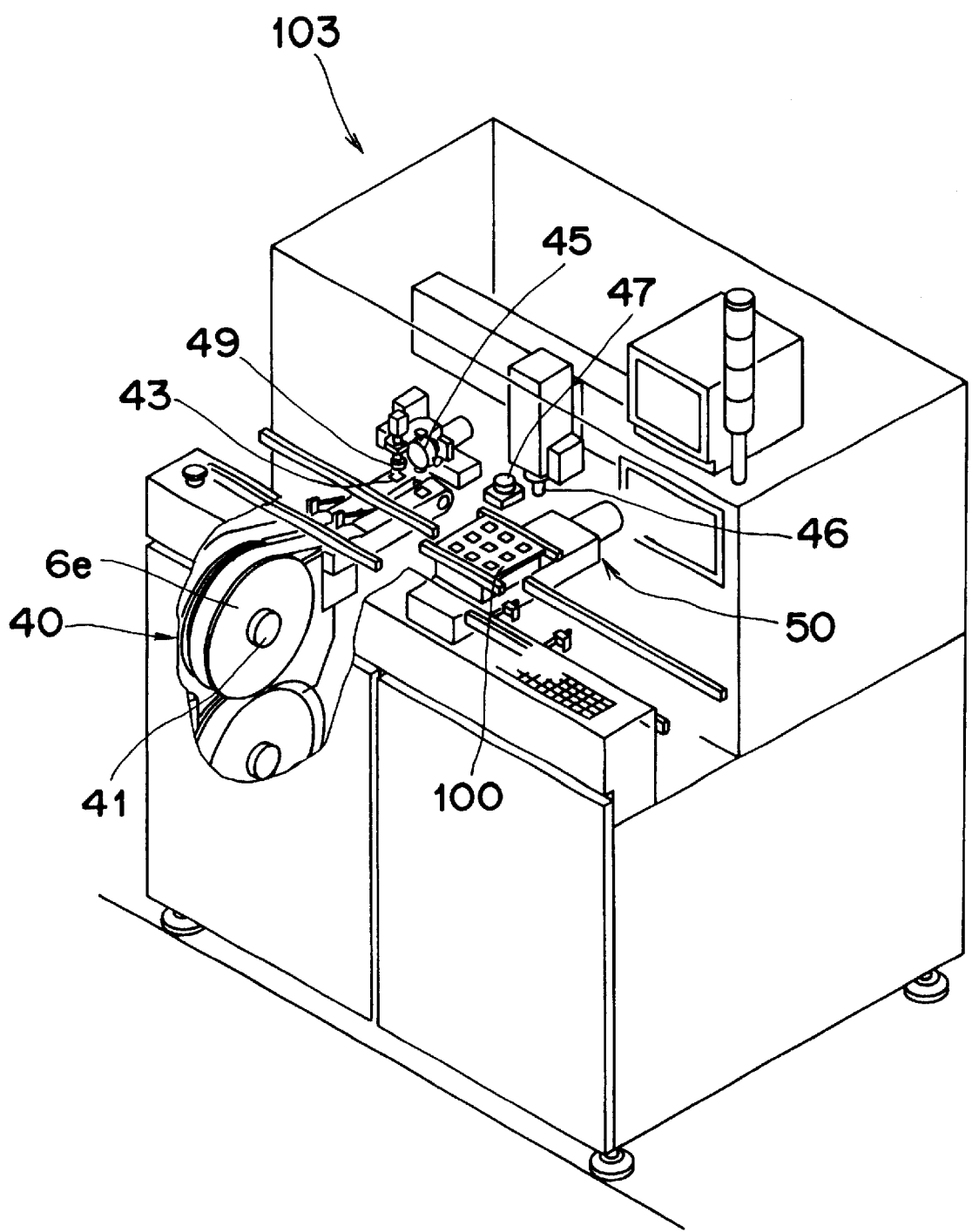
FIG. 9 is a schematic perspective view of the mounting machine.

The IC chip 2 is mounted in the mount process by a mounting machine 103. In the mount process, as shown in FIGS. 7–9, a feed reel 6e which is the reel 6d sent from the pre-mount process is set at an IC chip feeding apparatus 40. The tape-shaped supporting member 5 is rewound at the IC chip feeding apparatus 40 to be sent to a feed section 42 because of the intermittent rotation of a feed shaft 41 rotated by a driving device 41a such as a motor. One IC chip 2 exposed at a feed window 43 of the feed section 42 is sucked apart from the tape-shaped supporting member 5 by a suction nozzle 44 of a reversing apparatus 45. Then the tape-shaped supporting member 5 is wound sequentially to a storage reel 6f by the intermittent rotation of a feed shaft 41' rotated by a driving device 41'a such as a motor, etc. The reversing apparatus 45 is rotated by 180 degrees by a motor 48, the first nozzle 44 sucking the IC chip 2 is rotated from a facedown state to a faceup state, thereby changing an attitude of the IC chip 2 by 180 degrees. In other words, while being sucked by the first nozzle 44 from the IC chip feeding apparatus 40, the IC chip 2 has its rear face, namely, mount face directed upside which is sucked by the first nozzle 44. When the first nozzle 44 is reversed by 180 degrees by the reversing apparatus 45 and faced up, the IC chip 2 has its front face directed upside. The front face of the IC chip 2 is sucked by a second nozzle 46, whereby the rear face of the IC chip 2 is faced down. In this state, the nozzle 46 is moved up and down to a saucer 47 of a film-like conductive paste. As a result, the conductive paste is adhered (transferred) to the bumps 20 at the rear face of the IC chip 2 sucked by the nozzle 46. The nozzle 44 is moved to above a mount position of a board 100 held by a board holding apparatus 50. The nozzle 46 is then lowered, so that the IC chip 2 is mounted to the mount position of the board 100. The nozzle 46 is moved up and down by a driving device 46a such as a motor, and also moved between the reversing apparatus 45, the conductive paste saucer 47, and the board holding apparatus 50 along a movement guide unit 46b by a driving device 46c such as a motor. Since the nozzle 46 moves in the X-axis direction with respect to the board 100 and the board 100 moves in the Y-axis direction, the IC chip can be mounted at a required position of the board 100 both in the X-axis and the Y-axis directions. A locus of the nozzle 46 is indicated by an arrow in FIG. 8. The board 100 having the IC chip 2 mounted thereon is transferred into a high-temperature furnace and the conductive paste between the bumps 20 of the IC chip 2 and the board 100 is hardened. A sealing resin is supplied between the IC chip 2 and the board 100, etc. and set in the high-temperature furnace, and then, the mount process is completed. In FIGS. 8 and 9, 49 is a camera for inspecting a state of the IC chip 2 exposed at the feed window 43 of the IC chip feeding apparatus 40. The driving of the driving devices 41a, 41'a for the rotary shafts 41, 41', the motor 48 and nozzle 44 of the reversing apparatus 45 in suction and suction release operations, the nozzle 46 in suction and suction release operations, the driving device 46a for moving the nozzle 46 up and down, the driving device 6c for moving the nozzle, the driving device 50a for moving the board holding apparatus 50 in the Y-axis direction is controlled by a control device 67.

Figure 10:
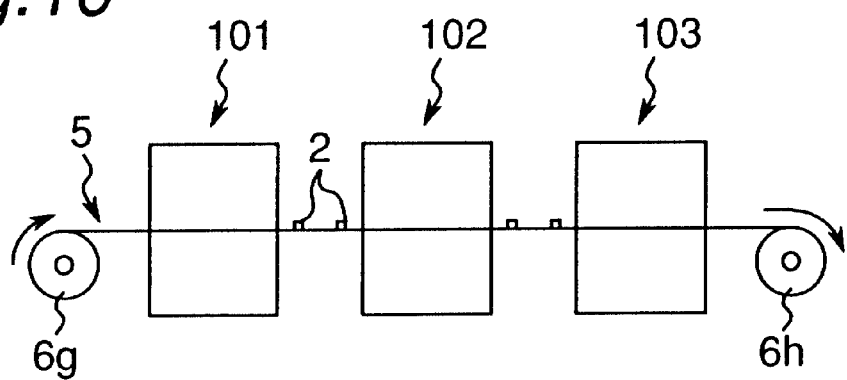
FIG. 10 is a diagram explanatory of a method and an apparatus for mounting IC chips according to a second embodiment of the present invention.

In the above first embodiment, the reel 6 storing the tape-shaped supporting member 5 is rewound and wound at each time of the taping process of holding the IC chips 2 in the tape-shaped supporting member 5, the pre-mount process, and the mount process. As a second embodiment of the present invention, as shown in FIG. 10, while the tape-shaped supporting member 5 is intermittently sent from a feed reel 6g to a storage reel 6h, the taping process is conducted by a taping apparatus 101, the pre-mount process comprising a bump bonding, a leveling, and a bump inspection processes is carried out by a bump forming apparatus 102, and the mount process of mounting the IC chips 2 to the board 100 is carried out by a mounting machine 103. These processes are generally executed in a clean room. In this case, not only the need for rewinding and winding the tape-shaped supporting member 5 at each process is eliminated, but the need for vacuum-packing the reel for transferring the reel is eliminated.

Next, a structure of the tape-shaped supporting member 5 used in each of the above embodiments will be described below.

Figure 11:
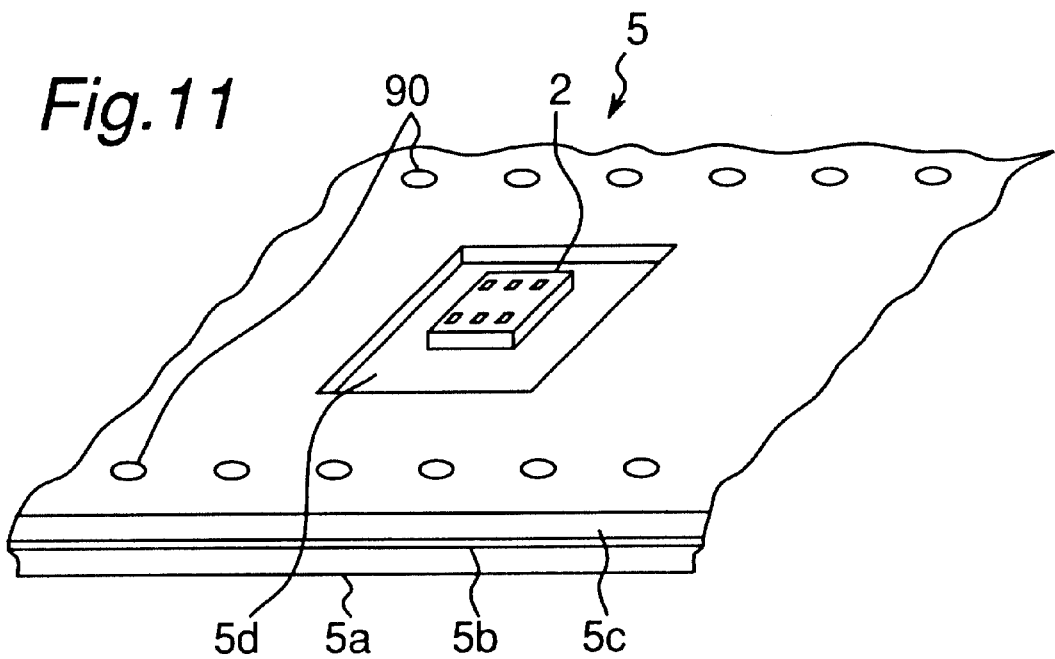
FIG. 11 is a partial perspective view of a tape-shaped supporting member used in the second embodiment of the present invention.

The tape-shaped supporting member 5 includes, as is shown in FIG. 11, a tape-shaped (elongated) base film 5a and an adhesive layer 5b arranged on the base film 5a for holding the IC chips 2. Each of the base film 5a and the adhesive layer 5b has an air permeability and a thickness large enough to vacuum-suck the surface of the IC chip 2 contacting the adhesive layer 5b and thereby securely hold the IC chip 2 at a predetermined position thereof when the IC chips 2 are vacuum-sucked so as to fix the IC chips 2 onto the adhesive layer 5b in the bump bonding process of the pre-mount process of the IC chips 2 while the IC chips 2 are held on the adhesive layer 5b. Feed holes 90 penetrating the supporting member 5 are formed at every predetermined distance at both or one end part of the tape-shaped supporting member 5 in a widthwise direction. The feed holes help the tape-shaped supporting member 5 run intermittently and regularly at a predetermined pitch in each process.

The base film 5a is preferably formed of resin such as polyimide. In the event that the IC chip 2 in the tape-shaped supporting member 5 is heated to high temperatures in the pre-mount process, the base film is preferably resistive to heat. Moreover, the base film 5a is required to have a rigidity enabling the pre-mount process to be carried out smoothly while the IC chip 2 is caught on the adhesive layer 5b in the pre-mount process. Specifically, for instance, the rigidity must be at a level to prevent the base film 5a from being damaged when pressured as the bumps are leveled in the bump formation process. Although not shown in the drawing, many holes may be formed in the base film 5a to secure a predetermined gas permeability, so that the IC chip 2 can be more surely sucked in each process.

The adhesive layer 5b is adapted to exert an adhesion such that the adhesive layer 5b can hold the IC chip 2 even during the transfer of the IC chip among the processes and during the taping process and the pre-mount process. At the same time, the adhesive layer 5b can be smoothly separated from the IC chip 2 when the IC chip 2 is sucked and taken out from the tape-shaped supporting member 5 by the nozzle in the mount process. Although the adhesive layer 5b is preferred to be formed all over the base film 5a in a nearly uniform thickness, the adhesive layer may be formed in an optional pattern such as a dot pattern, a striped pattern, etc. so long as the adhesive layer can ensure the holding of the IC chip 2 as above. When the IC chip 2 is sufficiently sucked through the base film 5a in the taping process and the premount process, the adhesion of the adhesive layer 5b may be weakened to an extent whereby the IC chip 2 is not detached from the adhesive layer 5b when the tape-shaped supporting member 5 is transferred or is wound on the reel 6 and transferred. Alternatively, the adhesive layer 5b may be formed of thermosoftening resin or resin capable of softening by ultraviolet rays to reduce the adhesion in the mount process. In this case, the adhesive layer 5b is softened by heat or radiation of ultraviolet rays before the IC chip 2 is taken out by the nozzle 44 from the IC chip feeding apparatus 40 in the mount process, thereby decreasing the adhesion.

Preferably, as a metallic carrier tape for providing further rigidity in the tape-shaped supporting member 5, a metallic layer Sc is provided on the adhesive layer 5b. Openings 5d are formed in the metallic layer 5c at every predetermined distance so that the IC chips 2 hold to the adhesive layer 5b. The metallic layer 5c may be arranged on the adhesive layer 5b with the utilization of the adhesion of the adhesive layer 5b. Otherwise, the adhesive layer 5b may be formed only at a central part of the base film 5a facing the openings 5d of the metallic layer 5c) and the base film 5a and the metallic layer 5c may be pressed and thermally fused at both end parts or tightly bonded via an adhesive layer having a larger adhesion than the adhesive layer 5b. In order to be able to hold IC chips 2 having various kinds of sizes in the tape-shaped supporting member 5, opening 5d of the metallic layer 5c may be made slightly larger than the IC chip 2 of the maximum size to be held at the tape-shaped supporting member 5. Therefore, the opening 5d can accommodate IC chips 2 of every size. For example, when the tape-shaped supporting member 5 is to hold small IC chips of a 0.2–0.3 mm square to large IC chips of a 25 mm square, the opening 5d is formed larger than the 25 mm square, so that every kind of IC chip can be held in one tape-shaped supporting member 5. Even one kind of tape-shaped supporting member 5 (that is, the tape-shaped supporting member 5 produced so as to hold the 25 mm square IC chips) can accordingly be used to hold 0.2 mm square IC chips 2. The tape-shaped supporting member 5 can provide general versatility. When the tape-shaped supporting member 5 used to hold the 25 mm square IC chips is collected after the mount process, the collected tape-shaped supporting member 5 can be reused to hold 0.2 mm IC chips, so that the tape-shaped supporting member 5 is versatile.

Figure 12:
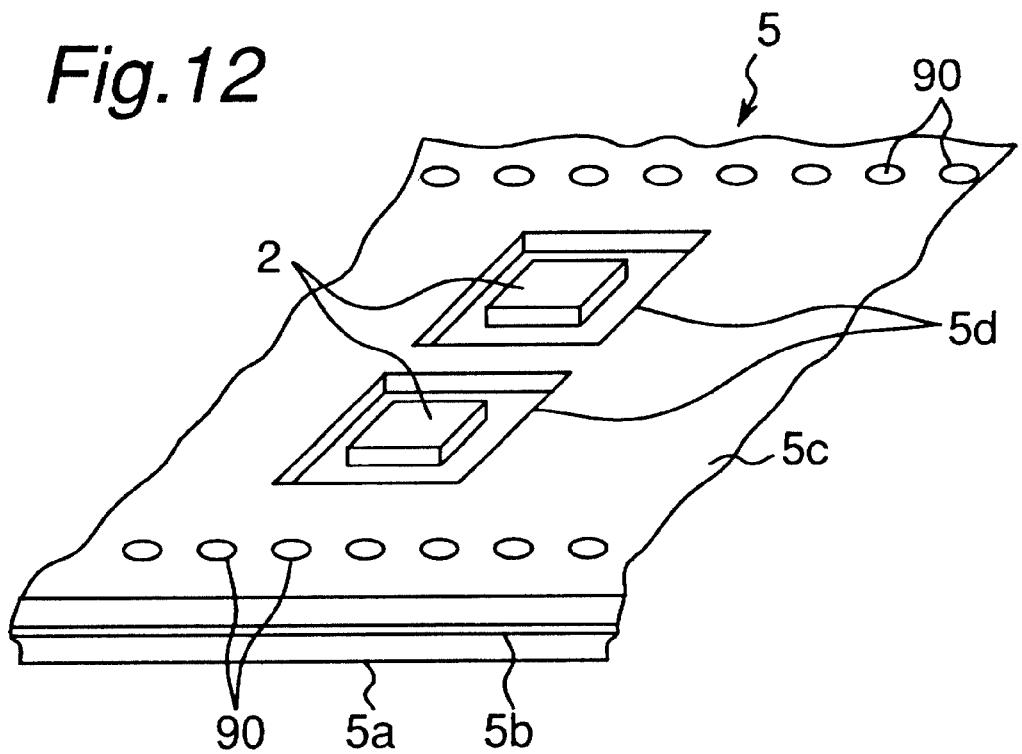
FIG. 12 is a partial perspective view of a tape-shaped supporting member according to a third embodiment of the present invention.

As shown in FIG. 12, in a third embodiment of the present invention, two openings 5d may be formed side by side in the widthwise direction of the tape-shaped supporting member 5 to hold two IC chips 2. The number of openings located side by side in the widthwise direction of the tape-shaped supporting member 5 is not limited to two, but may be an arbitrary value.

Figure 13:
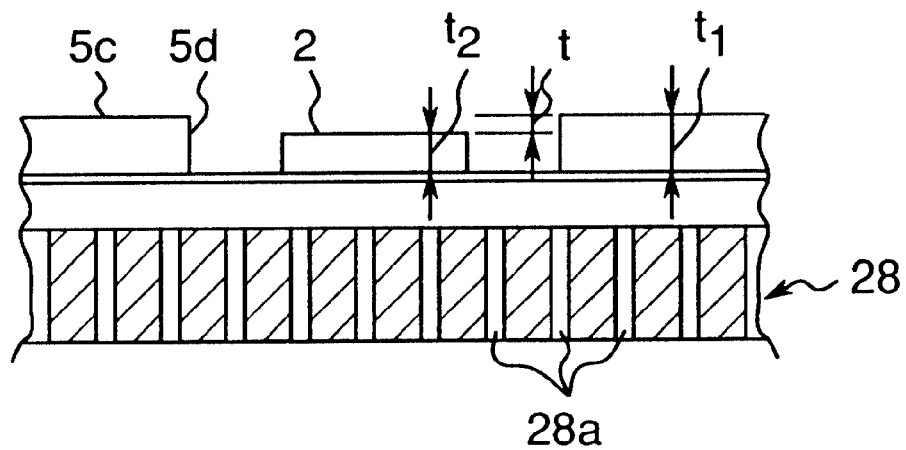
FIG. 13 is a partially sectional, partial side view of a tape-shaped supporting member and a guide plate when the tape-shaped supporting member of FIG. 11 is used in a bump formation process according to a fourth embodiment of the present invention.
Figure 14:
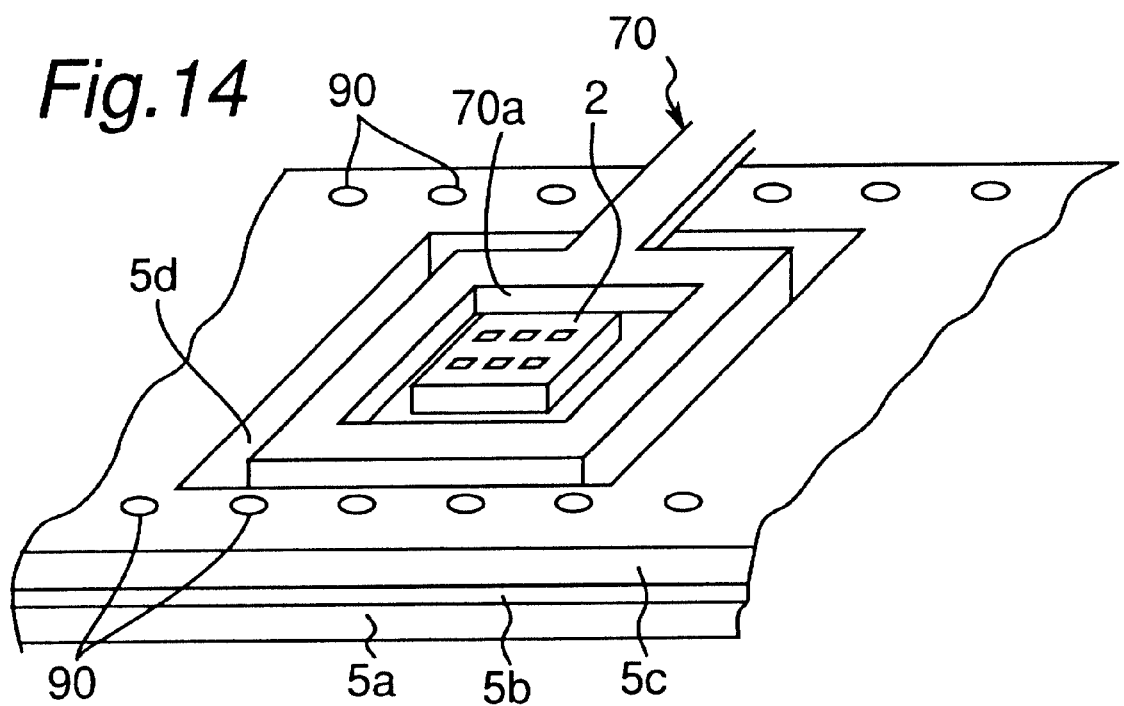
FIG. 14 is a partial perspective view when a press tool is inserted into a tape-shaped supporting member according to a fifth embodiment of the present invention.
Figure 15:
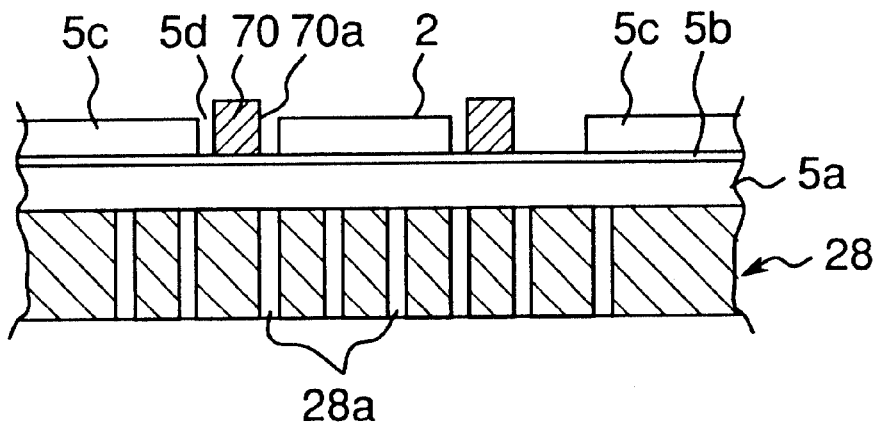
FIG. 15 is a partially sectional, partial side view of a tape-shaped supporting member and a guide plate in a state of FIG. 14 in a bump formation process according to the fifth embodiment of the present invention.

According to a fourth embodiment of the present invention, a thickness $t_1$ of the metallic layer 5c is made larger than a thickness $t_2$ of the IC chip 2, as is clearly seen in FIG. 13. In this case, the IC chip 2 is prevented from touching a rear face of the tape-shaped supporting member 5 when the tape-shaped supporting member 5 is wound to the reel 6. The fourth embodiment is advantageous from the viewpoint of protection to the IC chip 2. However, when the tape-shaped supporting member 5 is a strip-like lead frame (having the same side view as FIG. 18) and not wound to the reel 6, an interval of the lead frames when layered in a lead frame storage tray is generally regulated by a regulating member of the lead frame storage tray. Therefore, the IC chip 2 is naturally prevented from coming in touch with the lead frame type supporting member 5. That is, the IC chip 2 may be allowed to be larger in thickness than the metallic layer 5c in the case of the lead frame type supporting member 5. Alternatively, a protecting projection that is higher than the IC chip 2 may be formed in the neighborhood of the IC chip 2 in the case of the tape-shaped supporting member 5 wound to the reel 6, thereby preventing the IC chip 2 from coming in touch with the tape-shaped supporting member 5 thereabove.

The opening 5d of the metallic layer 5c can be larger than the IC chip 2 from a relationship to the other processes. For example, if the IC chip 2 is too small to be sucked well towards the guide plate 28 through the suction holes 28a when the bumps 20 are formed on the IC chips 2 in the pre-mount process, the opening 5d is formed in a size whereby a frame-like press tool 70 can be inserted into the opening 5d of the metallic layer 5c, which is a fifth embodiment of the present invention represented in FIGS. 14 and 15. According to such a construction, the adhesive layer 5b and the base film 5a in the periphery of the IC chip 2 are pressed and retained to the guide plate 28 by the press tool 70, thereby stably and securely holding the IC chip 2 inside an opening 70a of a frame of the press tool 70 against the guide plate 28. If no IC chip of a different size is to be loaded at a part of the adhesive layer 5b which is pressed and retained by the press tool 70, the adhesive layer 5b is not formed at the part. If the IC chip 2 of a different size is loaded at the part of the adhesive layer 5b which is pressed and retained by the press tool 70, the adhesive layer 5b is formed all over a central part of the opening 70a or in small dots at the central part of the opening 70a to surely hold the IC chip 2, whereas the adhesive layer 5b is formed roughly in dots at the part which is pressed and retained by the tool 70, thereby reducing the adhesion at the part. The press tool 70 after pressing the adhesive layer 5b may thus be separated from the tape-shaped supporting member 5 smoothly.

Figure 16:
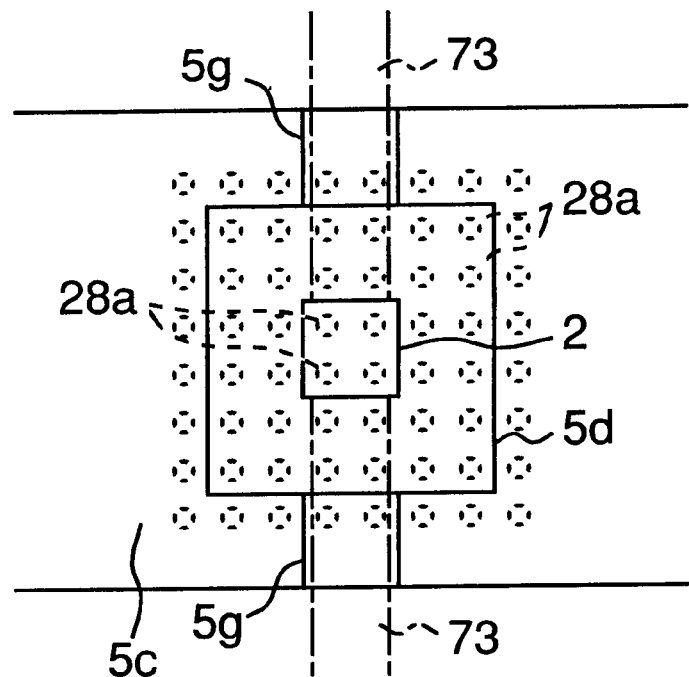
FIG. 16 is a partial perspective view when a regulating member is inserted into a tape-shaped supporting member according to a sixth embodiment of the present invention in the bump formation process.
Figure 17:
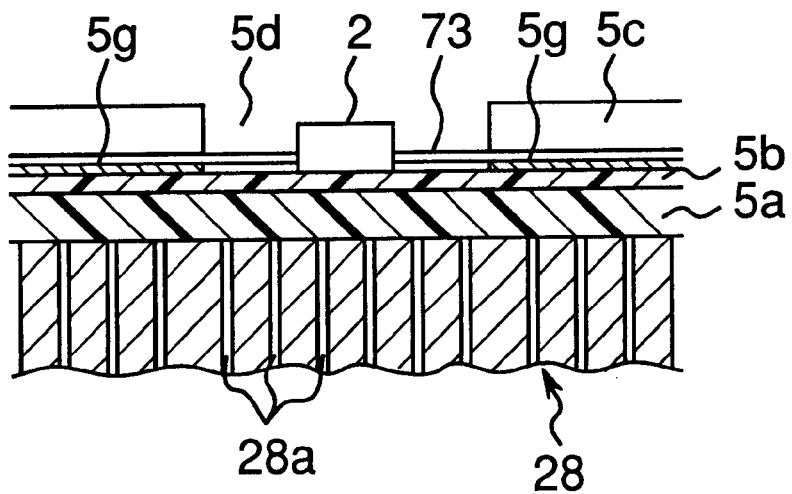
FIG. 17 is a partially sectional, partial side view of the tape-shaped supporting member and the guide plate in a state of FIG. 16 in the bump formation process according to the sixth embodiment of the present invention.

A sixth embodiment of the present invention is indicated in FIGS. 16 and 17. The metallic layer 5c of the sixth embodiment has introduction grooves 5g for regulating members which extend in the widthwise direction from the opening 5d. Two plate-shaped regulating members 73, in place of the press tool 70, are inserted into the opening 5d with the use of the grooves 5g of the metallic layer 5c from both sides of the tape-shaped supporting member 5, thereby holding the IC chip 2 in the opening 5d between the two regulating member. The IC chip 2 may be securely held in this manner. The groove 5g may be a notch and the metallic layer 5c may be totally eliminated at the notch part.

Figure 18:
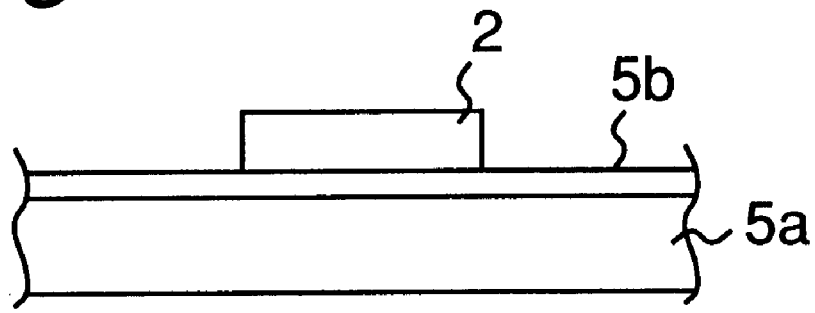
FIG. 18 is a partial side view of a tape-shaped supporting member according to a seventh embodiment of the present invention.

In a seventh embodiment of the present invention, as shown in FIG. 18, the tape-shaped supporting member 5 is constituted of only the adhesive layer 5b and the base film 5a without forming the metallic layer 5c. The base film 5a in this embodiment is preferably formed of a material having such rigidity and thickness that can endure treatments at each process and running of the tape-shaped supporting member 5. The IC chip 2 can be held with an optional pitch in conformity with the size thereof.

Figure 19:
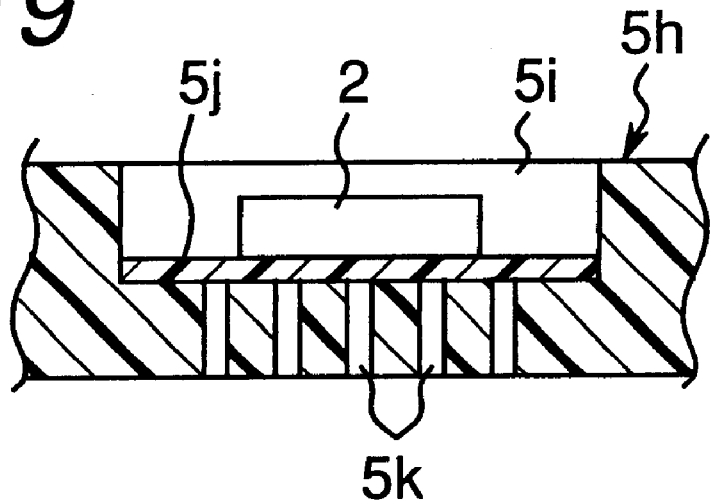
FIG. 19 is a partial sectional side view of a tape-shaped supporting member according to an eighth embodiment of the present invention.

Further in an eighth embodiment of the present invention, as shown in FIG. 19, the tape-shaped supporting member 5 is not comprised of a plurality of layers as discussed hereinabove, but may be a tape-shaped supporting member 5h formed of synthetic resin or the like. The supporting member 5h has recesses 5i in which the IC chips 2 can be stored and adhesive layers 5j set at bottom faces of the recesses 5i for holding the IC chips 2 within the recesses 5i. In this case, preferably, vacuum suction holes 5k are formed at the bottom face of the recess 5i of the supporting member 5h, so that when the IC chip 2 is surely held via the tape-shaped supporting member 5 through vacuum suction at each process, the IC chip 2 can be surely vacuum-sucked by utilizing the vacuum suction holes 5k.

In a further embodiment, in place of the arrangement of the metallic layer 5c, a protecting layer of synthetic resin, etc. that can provide the same rigidity as the metallic layer 5c in the tape-shaped supporting member 5 can be formed. The metallic layer 5c or the protecting layer may be arranged partly, for example, only at both end parts of the tape-shaped supporting member 5, not all over the tape-shaped supporting member 5 excluding the openings 5d.

According to the above embodiments, in the pre-mount process, the IC chip 2 can be subjected to the pre-mount treatment such as the bump formation process or the like in a state while the IC chips 2 are held in the tape-shaped supporting member 5 without taking out the IC chips from the tape-shaped supporting member 5. Thus, the IC chip 2 can be prevented from being damaged, unlike the prior art wherein the IC chip is detached from the tape-shaped supporting member 5 and held again by the tape-shaped supporting member 5 before the mount process. An apparatus for separating the IC chip 2 and the allowing the IC chip to be held again is hence eliminated. A process of separating the IC chip 2 and letting the IC chip 2 to be held again is hence eliminated in the pre-mount process. Thus, a total cycle time for the mount process of the IC chips 2 can be shortened.

The storage recess of the conventional tray is formed in size to conform to the IC chip 2 so as to avoid an unexpected movement of the IC chip in the storage recess. Thus, the size of the tray should be changed when the IC chip is made different in size. According to each of the foregoing embodiments, the opening 5d in the metallic layer 5c of the tape-shaped supporting member 5 having the metallic layer 5c which accommodates the IC chip 2 is formed so as not to be smaller than the maximum size of various IC chips 2. Therefore, one kind of tape-shaped supporting member 5 meets IC chips 2 of any size. The tape-shaped supporting member 5 without the metallic layer 5c can support IC chips of any size in the state as they are. The tape-shaped supporting member 5 becomes highly versatile, thereby solving the issues in the prior art. In a case where the tape-shaped supporting member 5 has general versatility in each of the embodiments, in order to hold the IC chip 2 within the opening 5d by the adhesive layer 5b of the tape-shaped supporting member 5, even if the opening 5d is made larger in size than the IC chip 2, the IC chip 2 is prevented from moving unexpectedly within the opening 5d, and consequently can be prevented from being damaged.

In a case where the IC chip 2 is small, a count of vacuum suction holes facing the IC chip 2 and capable of sucking the IC chip 2 when the IC chip 2 is vacuum-sucked at each process decreases, and thus an issue is raised that a suction and holding force to the IC chip 2 might be reduced. But a shortage of a suction and holding force can be compensated for by increasing the adhesion of the adhesive layer 5b of the tape-shaped supporting member 5.

When the formed bumps 20 are leveled in height in the pre-mount process, if the IC chip 2 itself warps, the bumps 20 are apt to be nonuniformly leveled in the prior art. However, during the leveling carried out with the IC chip 2 held by the tape-shaped supporting member 5, the warp of the IC chip 2 can be absorbed by the base film 5a of the tape-shaped supporting member 5 when the press force at the time of leveling acts on the tape-shaped supporting member 5 and the IC chip 2. Thus, accuracy in leveling can be further improved.

The present invention is not limited to the above-described embodiments and can be modified in various ways.

For instance, the pre-mount process is not limited to only the bump formation process, but includes any other treatments required before the mount process.

Figure 20:
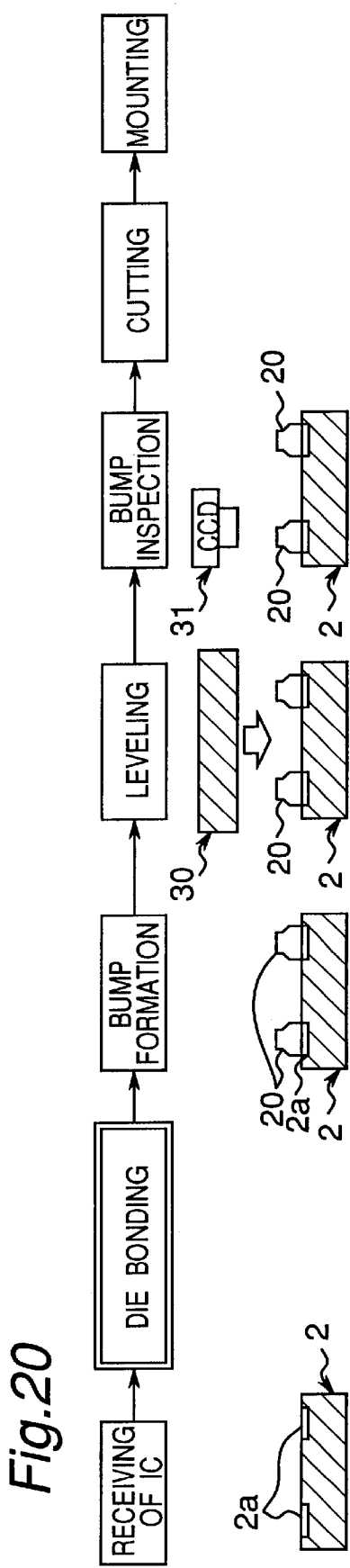
FIG. 20 is a diagram explanatory of an IC chip mount method according to a ninth embodiment of the present invention.
Figure 21:
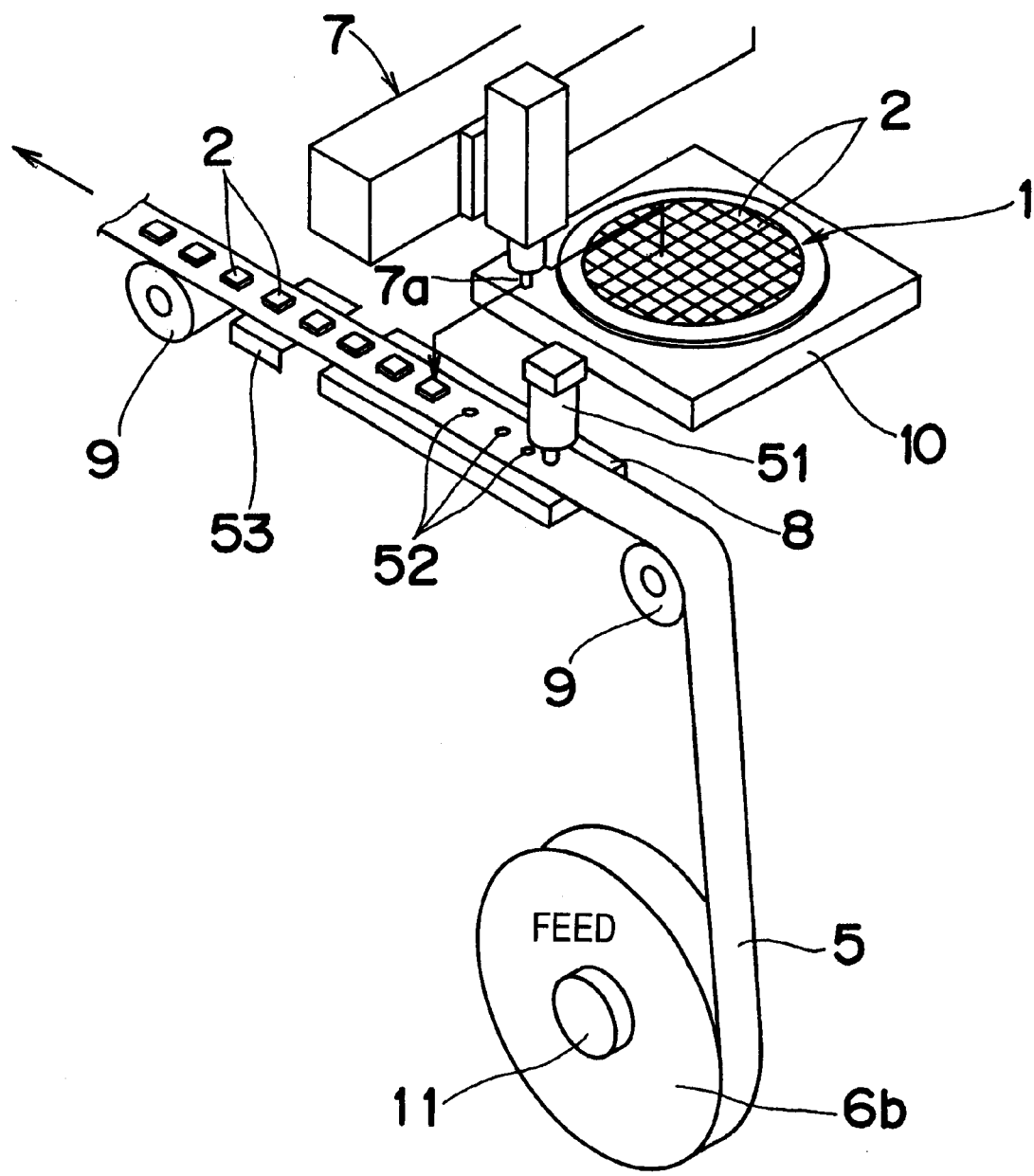
FIG. 21 is a schematic perspective view of an IC chip mounting apparatus including a die bonding process for holding an IC chip to a tape-shaped supporting member according to the ninth embodiment of the present invention.

While the taping process is performed by the taping apparatus 101 in the second embodiment, a die bonding method is employed in a ninth embodiment of the present invention. That is, the base film 5 which is the tape-shaped supporting member 5 is made of metal (e.g., aluminum or copper used for several tens um–100 μm thick lead frames), on which a die bonding paste (e.g., silver palladium or the like) 52 is applied by a paste applying apparatus 51. The paste is then hardened by a cure section 53 with heat (e.g., by heating silver paste at 180° C. for five minutes) after the IC chip 2 is loaded on the die bonding paste 52 (with reference to FIGS. 20 and 21). The method enables the IC chip 2 to be perfectly secured to the base film 5, thereby making good junction in the bump formation process which is the pre-mount process. Moreover, since the base film 5 is a single metallic layer, it is advantageous in terms of tape quality and costs.

Figure 22:
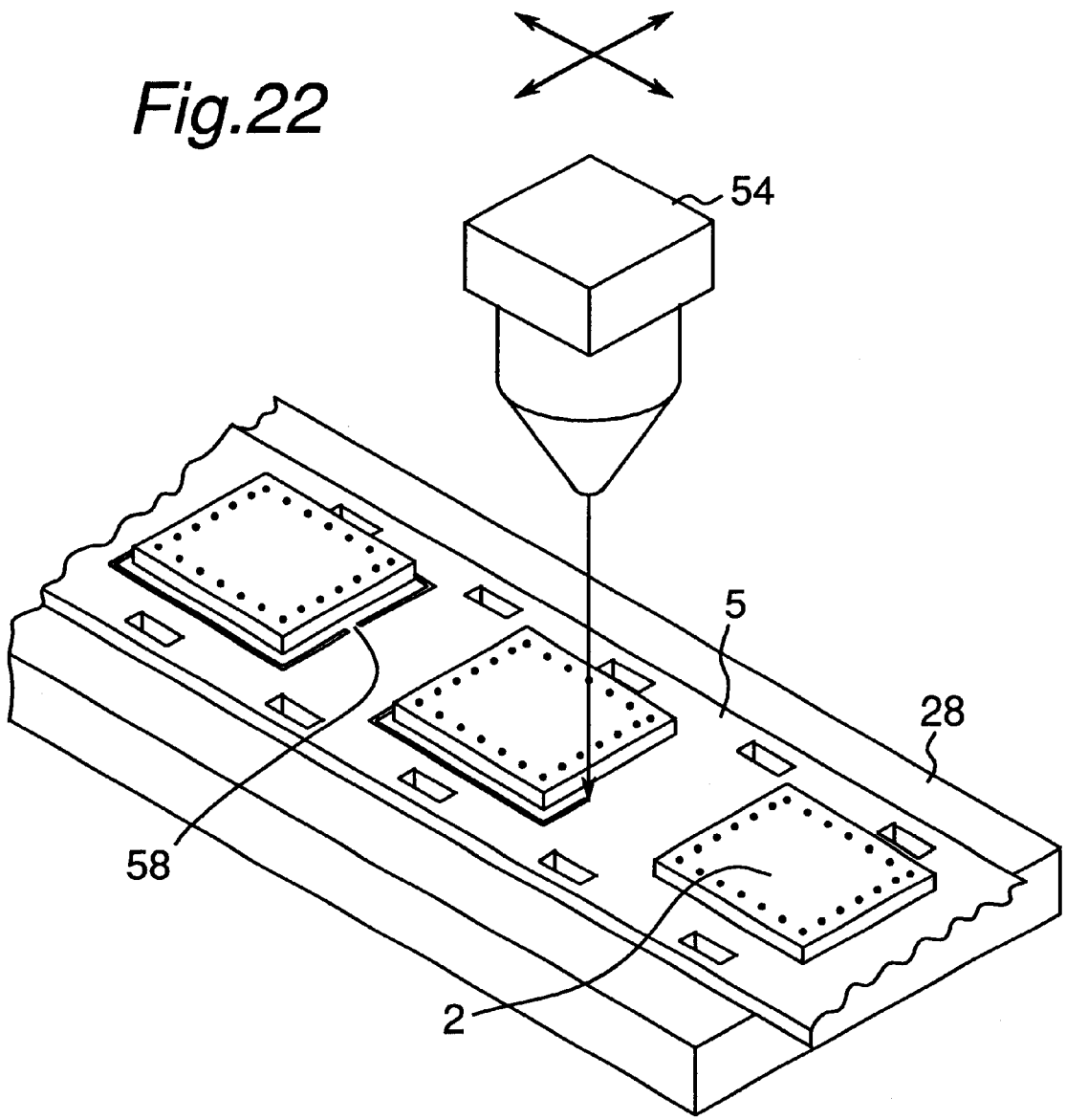
FIG. 22 is a perspective view of a base film cutter apparatus in the ninth embodiment of the present invention.

In the above ninth embodiment of the present invention, a laser projection apparatus 54 is provided for taking out the IC chip 2 from the base film 5, as shown in FIG. 22. The laser projection apparatus 54 is used as a kind of a cutter apparatus as one example of the IC chip removing apparatus so that the metallic base film 5 is burnt off through the projection of laser light. Then the IC chip 2 is sent to the next mount process with the base film 5 still attaching thereto. According to this embodiment, since the base film 5 is burnt off through the laser projection, even when the IC chip 2 differs in size or shape, the burning-off can easily cope with this by changing a projection position of laser light so as to cope with the different size or shape of the IC chip. When the IC chip and a part of the tape-shaped supporting member are integrally taken out from the tape-shaped supporting member as above, the bump bonding process as an example of the pre-mount process can result in good junction and the IC chip can be effectively prevented from possible damages when taken outside from the tape-shaped supporting member.

Figure 23:
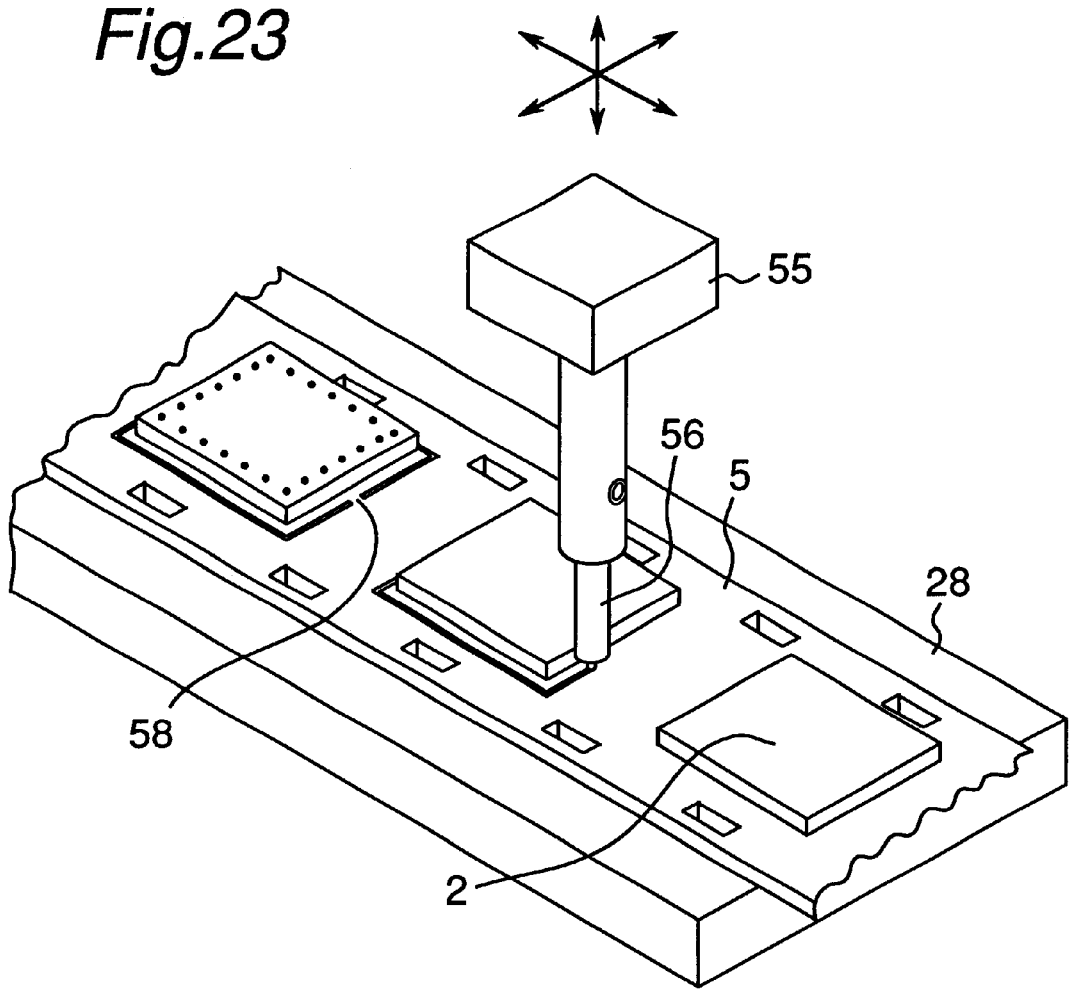
FIG. 23 is a perspective view of a base film cutter apparatus according to a tenth embodiment of the present invention.

There is another method of the cutting wherein as shown in FIG. 23, as a tenth embodiment of the present invention, the metallic base film 5 is cut with a cutter 56 of a cutter apparatus 55 as one example of the cutter apparatus for the IC chip removing apparatus. The IC chip 2 and a part of the base film 5 can be thus integrally taken out, thereby achieving the same effect as in the ninth embodiment. As the cutter 56 fixed at a leading end of the cutter apparatus 55, for example, a diamond cutter etc. may be used. According to this embodiment, since the base film 5 is cut by the cutter 56, the cutting can easily cope with a change in size or shape of the IC chip 2 by changing a cut position of the cutter 56 corresponding to the change.

Figure 24:
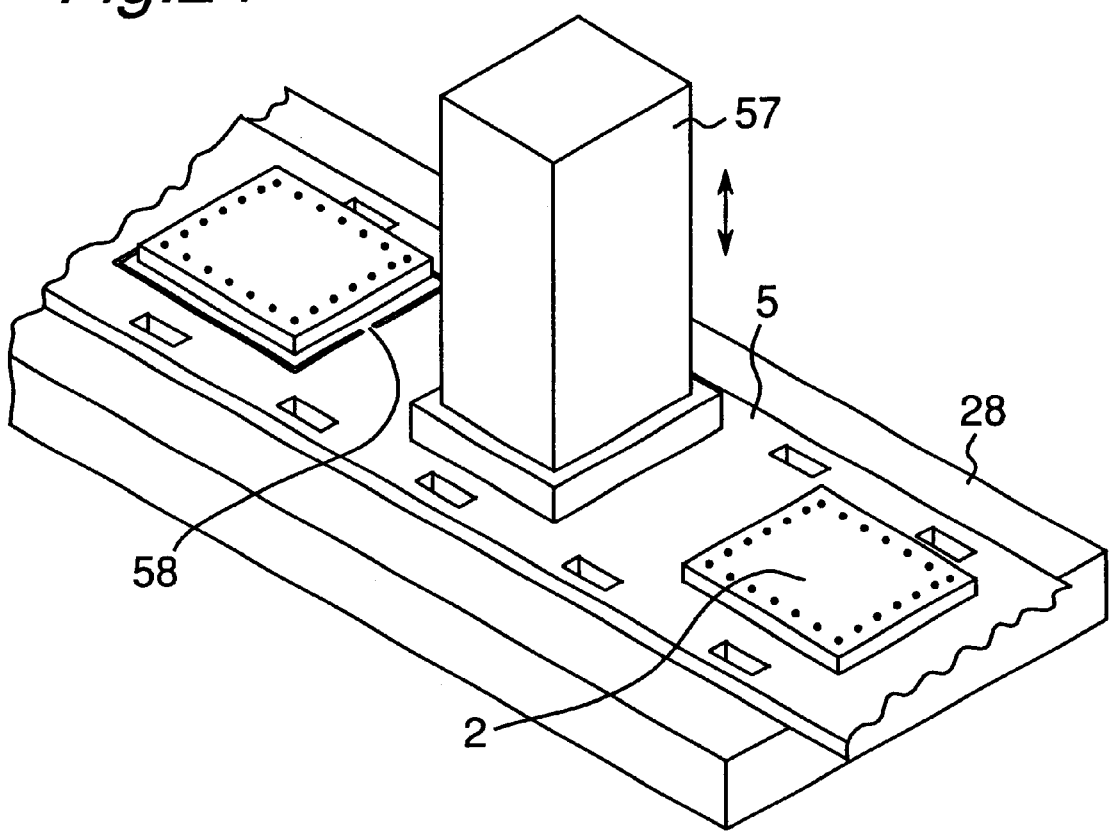
FIG. 24 is a perspective view of a base film cutter apparatus according to an eleventh embodiment of the present invention.

As an alternative way, a punch mold 57 is used as one example of the cutter apparatus for the IC chip removing apparatus according to an 11th embodiment of the present invention shown in FIG. 24. The IC chip 2 and a part of the base film 5 are integrally punched by the punch mold 57, thereby obtaining the same effect as in the ninth embodiment. In FIG. 24, the guide plate 28 has an opening part corresponding to the mold 57 and is therefore prevented from being damaged when the punch mold 57 descends to punch the base film 5. A cut speed for the base film 5 for punching of the mold 57 can be higher in the present embodiment than in the other embodiments.

In FIGS. 22–24, when cutting away from the base film 5 so as to avoid a wrong transfer due to a movement of the IC chip 2, the IC chip 2 and the part of the base film 5 are not completely cut away from the base film 5, and an IC chip hold part 58 connecting to a part of the remaining base film 5 is preferably left at the base film 5. A plurality of the IC chip hold parts 58 may be provided although only one is illustrated in FIGS. 22–24.

The IC chip 2 is moved together with the part of the base film 5 after being cut from the base film 5 in FIGS. 22–24. Alternatively, a pickup apparatus for the IC chip 2 (e.g., the reversing apparatus 45 of FIG. 8) in the next mount process may be moved to the cut position thereby picking up the IC chip 2 in order to avoid the wrong transfer referred to above.

Still referring to FIGS. 22 and 23, the guide plate 28 is preferably a rigid body such as hard metal or the like. However, the guide plate can be made exchangeable in accordance with a material of the tape-shaped supporting member 5, whereby the other kinds of material are utilizable.

Figure 25:
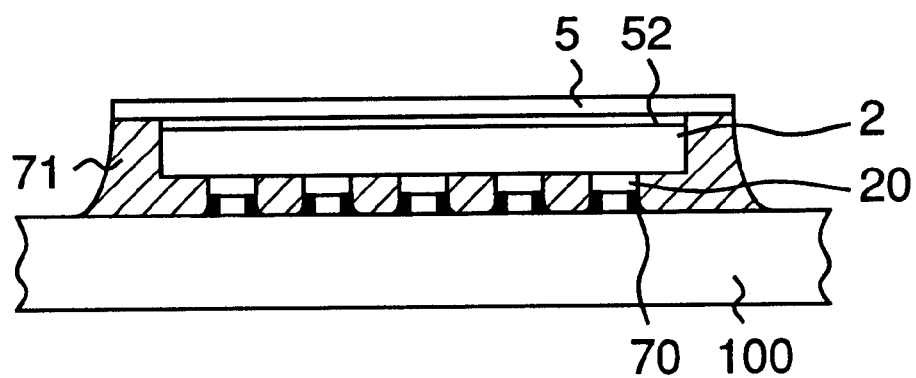
FIG. 25 is a sectional view of a mount state after sealing according to the ninth-eleventh embodiments of the present invention.
Figure 26:
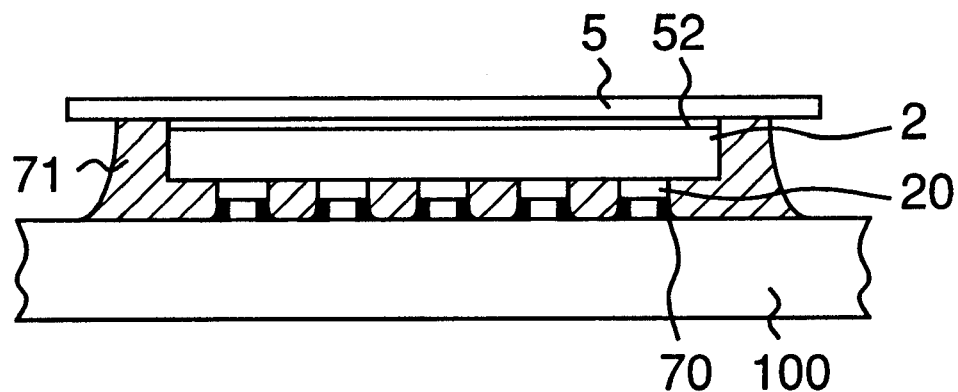
FIG. 26 is a sectional view of the mount state after sealing according to the ninth-eleventh embodiments of the present invention.

In the ninth through eleventh embodiments, FIGS. 25 and 26 indicate a state of the IC chip 2 mounted to the board 100 and sealed by the sealing resin 71 after the IC chip 2 is taken out together with the part of the base film 5 from the base film 5. FIG. 25 shows a case wherein the whole gap from the part of the base film 5 to the board 100 is entirely sealed by the sealing resin 71. In this example, the sealing resin 71 can be held with the utilization of the part of the base film 5 secured to the IC chip 2. FIG. 26 shows a case where only a gap between the IC chip 2 and the board 100 is sealed by the sealing resin 71.

The entire disclosure of Japanese Patent Application No. 8-244709 filed on Sep. 17, 1996 including the specification, claims, drawings and summary is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of mounting an IC chip to a board, comprising:
    placing an IC chip on a support tape member so that the IC chip is held on the support tape member;
    performing a pre-mount process while the IC chip is held on the support tape member, said performing of the pre-mount process including forming bumps on a rear surface of the IC chip; and
    mounting the IC chip having the bumps formed thereon onto a board after said performing of the pre-mount process.

2. The method of claim 1, wherein said forming of the bumps on the rear surface of the IC chip comprises forming the bumps from a position above the IC chip held on the support tape member.

3. The method of claim 1, wherein said performing of the pre-mount process further includes leveling of a height of the bumps formed on the rear surface of the IC chip, and includes inspecting a quality of the bumps formed on the rear surface.

4. The method of claim 1, further comprising removing the IC chip from the support tape member after said performing of the pre-mount process and prior to said mounting of the IC chip.

5. The method of claim 4, wherein said mounting of the IC chip comprises:
    sucking a front surface of the removed IC chip having the bumps formed on the rear surface;
    positioning the removed IC chip sucked at the front surface so that the rear surface of the IC chip faces toward the board; and
    bringing the bumps on the rear surface of the IC chip into contact with electrode pads on the board so as to mount the IC chip on the board.

6. The method of claim 4, further comprising:
    winding the support tape member holding the IC chips around a feed reel after said placing of the IC chip on the support tape member;
    unwinding the support tape member holding the IC chips from the feed reel before said performing of the pre-mount process;
    winding the support tape member holding the IC chips around the feed reel after said performing of the pre-mount process; and
    unwinding the support tape member holding the IC chips from the feed reel before said removing of the IC chip from the support tape member and before said mounting of the IC chip.

7. The method of claim 6, further comprising winding the support tape member around the feed reel after said removing of the IC chip from the support tape member.

8. The method of claim 1, wherein said placing of the IC chip on the support tape member comprises placing the IC chip on a support tape member comprising a lead frame.

9. The method of claim 1, further comprising:
    winding the support tape member holding the IC chips around a feed reel after said placing of the IC chip on the support tape member; and
    unwinding the support tape member holding the IC chips from the feed reel before said performing of the pre-mount process.

10. The method of claim 1, wherein said placing of the IC chip on the support tape member comprises placing the IC chip on a support tape member comprising:
    a base film; and
    an adhesive layer formed on the base film for holding the IC chip, wherein the base film and the adhesive layer each have a gas permeability so as to allow the IC chip to be vacuum-sucked through the base film and the adhesive layer and securely held at a predetermined position during said performing of the pre-mount process.

11. The method of claim 1, further comprising die-bonding the IC chip onto a base film of the support tape member.

12. The method of claim 11, further comprising removing the IC chip by cutting the support tape member after said performing of the pre-mount process.

13. The method of claim 12, wherein said cutting comprises burning away the support tape member by projection of laser light.

14. The method of claim 12, wherein said cutting comprises cutting away the support tape member by a cutter.

15. The method of claim 12, wherein said cutting comprises punching the support tape member by a punch mold.

16. The method of claim 1, wherein said placing of the IC chip on the support tape member comprises placing the IC chip on a support tape member comprising a metallic base film.

17. An IC chip mounting apparatus comprising:
a support tape member for holding an IC chip thereon;
a bump-forming apparatus for forming bumps on a rear surface of the IC chip while the IC chip is held by said support tape member; and
a mounting machine for mounting the IC chips having the bumps formed on the rear surface onto a board.

18. The apparatus of claim 17, wherein said bump-forming apparatus is positioned above said support tape member so as to form the bumps on the rear surface of the IC chip from above.

19. The apparatus of claim 17, further comprising:
a leveling apparatus for leveling a height of the bumps formed on the rear surface of the IC chips by said bump-forming apparatus; and
an inspecting apparatus for inspecting a quality of the bumps formed on the rear surface of the IC chips.

20. The apparatus of claim 17, wherein said mounting machine is adapted to remove the IC chips from said support tape member and position the IC chips on the board after said bump-forming apparatus forms the bumps of the rear surface of the IC chips.

21. The apparatus of claim 20, wherein said mounting machine is further adapted to:
suck a front surface of the removed IC chip having the bumps formed on the rear surface;
position the removed IC chip sucked at the front surface so that the rear surface of the IC chip faces toward the board; and
bring the bumps on the rear surface of the IC chip into contact with electrode pads on the board so as to mount the IC chip on the board.

22. The apparatus of claim 20, further comprising:
a support tape member feed reel for feeding said support tape member holding IC chips to said bump-forming apparatus for forming bumps on the IC chips; and
a support tape member storage reel for storing said support tape member holding IC chips having bumps formed by said bump-forming apparatus.

23. The apparatus of claim 22, further comprising:
a second support tape member feed reel for feeding said support tape member holding IC chips having bumps formed by said bump-forming apparatus to said mounting machine for removing the IC chips having bumps formed by said bump-forming apparatus; and
a second support tape member storage reel for storing said support tape member after the IC chips having bumps formed by said bump-forming apparatus are removed by said mounting machine.

24. The apparatus of claim 17, wherein said support tape member comprises a lead frame.

25. The apparatus of claim 17, wherein said support tape member is wound on a reel, and is unwound when bumps are to be formed on the rear surface of the IC chips held by said support tape member.

26. The apparatus of claim 17, wherein said support tape member comprises:
a base film; and
an adhesive layer formed on said base film for holding the IC chip, wherein said base film and said adhesive layer each have a gas permeability so as to allow the IC chip to be vacuum-sucked through said base film and said adhesive layer and securely held at a predetermined position when said bump-forming apparatus forms bumps on the rear surface of the IC chip.

27. The apparatus of claim 17, further comprising a die-bonding apparatus for die-bonding the IC chip onto a base film of said support tape member.

28. The apparatus of claim 27, wherein said mounting machine includes a support tape member cutting apparatus for removing the IC chip from said support tape member after said bump-forming apparatus forms bumps on the rear surface of the IC chip.

29. The apparatus of claim 28, wherein said support tape member cutting apparatus comprises a laser projection apparatus for burning through said support tape member by projecting laser light.

30. The apparatus of claim 28, wherein said support tape member cutting apparatus comprises a cutter for cutting through said support tape member.

31. The apparatus of claim 28, wherein said support tape member cutting apparatus comprises a punch mold for punching through said support tape member.

32. The apparatus of claim 17, wherein said support tape member comprises a metallic base film.

33. A support tape member for holding an IC chip, comprising:
a tape-shaped flat base film; and
an adhesive layer formed on said base film for holding the IC chip, wherein said base film and said adhesive layer each have a gas permeability so as to allow the IC chip to be vacuum-sucked through said base film and said adhesive layer and securely held at a predetermined position on said adhesive layer.

34. The support tape member of claim 33, further comprising a metallic layer disposed on said adhesive layer.

35. A support tape member for holding an IC chip, comprising:
a support body having a flat bottom surface, having an upper surface including a recess for storing an IC chip, and having a vacuum suction hole formed at a bottom face of said recess; and
an adhesive layer disposed on said bottom face of said recess for holding the IC chip within said recess when the IC chip is sucked through said vacuum suction hole.

36. The support tape member of claim 34, wherein said metallic layer includes an opening for placement of the IC chip onto said adhesive layer.

37. The support tape member of claim 36, wherein said adhsive layer is formed on said base film so as to cover an entirety of an upper surface of said base film.

38. The support tape member of claim 33, wherein said adhesive layer is formed on said base film so as to cover an entirety of an upper surface of said base film.

* * * * *